US009214930B2

(12) United States Patent
Soraoka

(10) Patent No.: US 9,214,930 B2
(45) Date of Patent: Dec. 15, 2015

(54) POWER SUPPLY VOLTAGE TRANSITION COMPARISON CIRCUIT, POWER SUPPLY VOLTAGE TRANSITION COMPARISON METHOD, AND SEMICONDUCTOR INTEGRATED CIRCUIT

(71) Applicant: Renesas Electronics Corporation, Kawasaki-shi (JP)

(72) Inventor: Makoto Soraoka, Yokohama (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 14/303,424

(22) Filed: Jun. 12, 2014

(65) Prior Publication Data

US 2015/0022240 A1  Jan. 22, 2015

(30) Foreign Application Priority Data

Jul. 17, 2013  (JP) .................................. 2013-148541

(51) Int. Cl.
| | |
|---|---|
| G06F 1/28 | (2006.01) |
| H03K 5/1534 | (2006.01) |
| G06F 1/32 | (2006.01) |

(52) U.S. Cl.
CPC ................ *H03K 5/1534* (2013.01); *G06F 1/28* (2013.01); *G06F 1/3212* (2013.01)

(58) Field of Classification Search
USPC ..................................................... 327/72, 76
See application file for complete search history.

(56) References Cited

U.S. PATENT DOCUMENTS

| 7,023,672 | B2* | 4/2006 | Goodfellow et al. ........... 361/18 |
| 7,843,249 | B2* | 11/2010 | Zhang et al. .................. 327/517 |
| 7,907,002 | B2* | 3/2011 | Bracmard et al. ............ 327/540 |
| 8,058,910 | B1* | 11/2011 | Wright .......................... 327/143 |
| 2007/0132486 | A1* | 6/2007 | O'Keefe ......................... 327/77 |
| 2010/0194201 | A1* | 8/2010 | Nozaki .......................... 307/80 |
| 2011/0095789 | A1* | 4/2011 | Tang et al. ...................... 327/72 |
| 2011/0215959 | A1* | 9/2011 | Matsuzawa et al. .......... 341/160 |
| 2012/0235844 | A1* | 9/2012 | Ito et al. ........................ 341/155 |
| 2014/0035596 | A1* | 2/2014 | Lee et al. ...................... 324/523 |

FOREIGN PATENT DOCUMENTS

| JP | 4-147074 A | 5/1992 |
| JP | 6-207971 A | 7/1994 |
| JP | 6-309475 A | 11/1994 |

* cited by examiner

*Primary Examiner* — Ryan Jager
(74) *Attorney, Agent, or Firm* — McGinn IP Law Group, PLLC

(57) ABSTRACT

The power supply voltage transition comparison circuit includes a comparator evaluation voltage setting circuit, a comparator, a voltage evaluation circuit, and an evaluation voltage setting value output circuit. The comparator evaluation voltage setting circuit generates a divided voltage of one of a power supply voltage and a reference voltage. The comparator compares the other of the power supply voltage and the reference voltage with the divided voltage. The voltage evaluation circuit evaluates the power supply voltage based on a result of a comparison between the other voltage and the divided voltage. The evaluation voltage setting value output circuit changes a ratio between the one voltage and the divided voltage based on a result of an evaluation of the power supply voltage.

16 Claims, 12 Drawing Sheets

| VALUE FOR EVALUATION STEP NUMBER SIGNAL | WAIT COUNT VALUE |
|---|---|
| 1 | 3 |
| 2 | 10 |
| 3 | 15 |
| 4 | 0 |
| 5 | 0 |
| 6 | 0 |
| 7 | 0 |

Fig. 6

| VALUE FOR EVALUATION STEP NUMBER SIGNAL | UPPER-LIMIT VOLTAGE (V) | LOWER-LIMIT VOLTAGE (V) |
|---|---|---|
| 1 | 5.0 | 4.0 |
| 2 | 3.0 | 2.0 |
| 3 | 4.0 | 3.0 |
| 4 | 5.0 | 4.0 |
| 5 | 5.0 | 4.0 |
| 6 | 5.0 | 4.0 |
| 7 | 5.0 | 4.0 |

Fig. 7

POWER SUPPLY VOLTAGE TRANSITION COMPARISON CIRCUIT, POWER SUPPLY VOLTAGE TRANSITION COMPARISON METHOD, AND SEMICONDUCTOR INTEGRATED CIRCUIT

CROSS-REFERENCE TO RELATED APPLICATIONS

This application is based upon and claims the benefit of priority from Japanese patent application No. 2013-148541, filed on Jul. 17, 2013, the disclosure of which is incorporated herein in its entirety by reference.

BACKGROUND

The present invention relates to a power supply voltage transition comparison circuit, a power supply voltage transition comparison method, and a semiconductor integrated circuit. For example, the present invention relates to a power supply voltage transition comparison circuit suitable for use in which a semiconductor integrated circuit is set to a test mode, a power supply voltage transition comparison method suitable for that use, and a semiconductor integrated circuit including the power supply voltage transition comparison circuit.

Test signal generation circuits for generating a test signal for setting a semiconductor integrated circuit such as a microcontroller to a test mode have been known. For example, a test signal generation circuit of a semiconductor device disclosed in Japanese Unexamined Patent Application Publication No. 4-147074 includes a high-voltage detection circuit, a counter, and a test signal latch. The high-voltage detection circuit determines whether or not a voltage higher than a normal power supply voltage is input to a first input terminal. The counter counts a clock signal that is input to a second input terminal while the voltage higher than the normal power supply voltage is input to the first input terminal. The test signal latch generates a test signal when the count number of the counter reaches a predetermined count number.

A test signal generation circuit of a semiconductor device disclosed in Japanese Unexamined Patent Application Publication No. 6-207971 includes a high-voltage detection circuit, a counter, and a test signal latch circuit. The high-voltage detection circuit determines whether or not a voltage higher than a normal power supply voltage is input to an input terminal, and outputs a high-voltage detection signal. The counter counts the high-voltage detection signal. The test signal latch circuit generates a test signal when the count number of the counter reaches a predetermined count number.

A test signal generation circuit disclosed in Japanese Unexamined Patent Application Publication No. 6-309475 includes first to third voltage comparators and a combinational logic circuit that logically processes the outputs of these comparators. The first voltage comparator compares a power supply voltage with a first reference voltage. The second voltage comparator compares the power supply voltage with a second reference voltage. The third voltage comparator compares the power supply voltage with a third reference voltage. The first reference voltage is higher than the second reference voltage, and the second reference voltage is higher than the third reference voltage. When the combinational logic circuit detects an output pattern that is output from the first to third comparators when a power supply voltage having a predetermined voltage waveform is input to the first to third comparators, the combinational logic circuit generates a test signal. When the test signal is generated, the circuit(s) to be tested is set to a test mode.

SUMMARY

In the test signal generation circuits disclosed in Japanese Unexamined Patent Application Publications No. 4-147074 and No. 6-207971, the input voltage to be evaluated is compared with one predetermined voltage level. The present inventor has found a problem that since the input voltage is compared with only one predetermined voltage level, it is difficult to lower the probability of an accidental match between the input voltage transition and the expected voltage transition that can lead to the generation of the test signal in the test signal generation circuit.

In the test signal generation circuit disclosed in Japanese Unexamined Patent Application Publication No. 6-309475, the power supply voltage to be evaluated is compared with a plurality of reference voltages. The inventor has found out that it is possible to lower the probability of an accidental match between the power supply voltage transition and the expected voltage transition that can lead to the generation of the test signal in the test signal generation circuit by increasing the number of reference voltages. However, if the number of reference voltages is increased in the test signal generation circuit, the number of voltage comparators increases, thus increasing the circuit size.

The above and other aspects, advantages and features will be more apparent from the following description of certain embodiments taken in conjunction with the accompanying drawings.

A first aspect of the present invention is a power supply voltage transition comparison circuit that evaluates a power supply voltage based on a result of a comparison between a divided voltage of one of the power supply voltage and a reference voltage and a voltage of the other of the power supply voltage and the reference voltage, and changes a ratio between the one voltage and the divided voltage based on a result of an evaluation of the power supply voltage.

According to the above-described first aspect, it is possible to lower the probability of an accidental match between the power supply voltage transition and the expected voltage transition while minimizing the increase in the circuit size of the circuit that compares the power supply voltage transition with the expected voltage transition.

BRIEF DESCRIPTION OF THE DRAWINGS

The above and other aspects, advantages and features will be more apparent from the following description of certain embodiments taken in conjunction with the accompanying drawings, in which:

FIG. 6 is a table held by a transition number WAIT time setting circuit according to the second embodiment;

FIG. 7 is a table held by an expected voltage setting circuit according to the second embodiment;

DETAILED DESCRIPTION

Embodiments of a power supply voltage transition comparison circuit, a power supply voltage transition comparison method, a program of a method for controlling a power supply voltage transition comparison circuit, and a semiconductor integrated circuit are explained hereinafter with reference to the drawings. For clarifying the explanation, the following descriptions and the drawings may be partially omitted or simplified as appropriate. Further, the same symbols are assigned to the same components throughout the drawings, and their duplicated explanation is omitted as necessary.

First Embodiment

Figure 1:
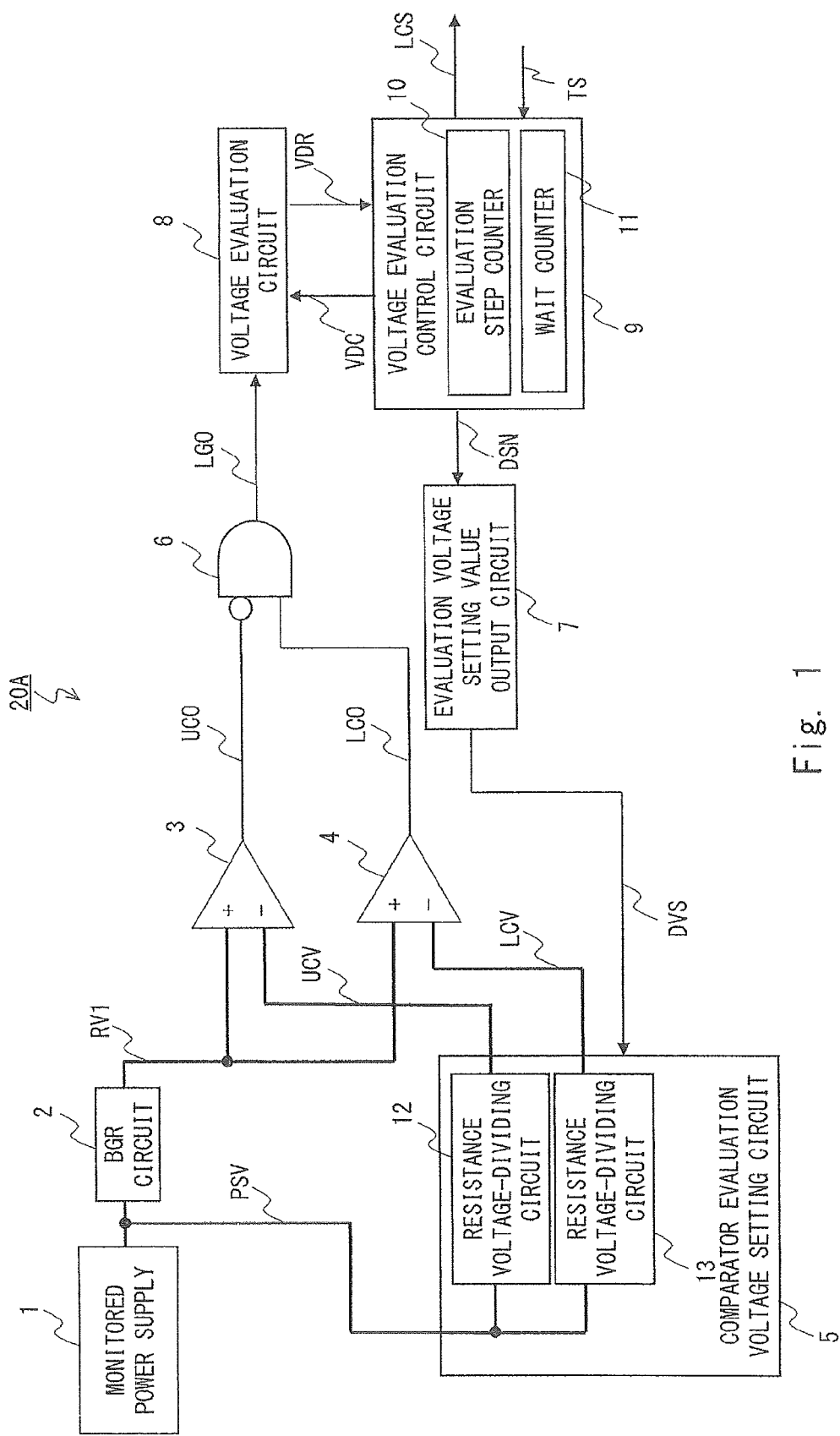
FIG. 1 is a circuit configuration diagram of a power supply voltage transition comparison circuit according to a first embodiment.

FIG. 1 is a circuit configuration diagram of a power supply voltage transition comparison circuit 20A according to a first embodiment. The power supply voltage transition comparison circuit 20A performs a comparison of a power supply voltage transition by determining whether or not a transition of a power supply voltage PSV to be monitored matches an expected voltage transition. Note that the expected voltage transition is a voltage transition that can generate a lock cancellation signal LCS for the power supply voltage transition comparison circuit 20A.

The power supply voltage transition comparison circuit 20A includes a comparator evaluation voltage setting circuit 5, comparators 3 and 4, a voltage evaluation circuit 8, and an evaluation voltage setting value output circuit 7. The comparator evaluation voltage setting circuit 5 generates an upper-limit comparison voltage UCV and a lower-limit comparison voltage LCV as divided voltages of the power supply voltage PSV. The comparator 3 compares the upper-limit comparison voltage UCV with a reference voltage RV1. The comparator 4 compares the lower-limit comparison voltage LCV with the reference voltage RV1. The voltage evaluation circuit 8 evaluates the power supply voltage PSV based on the result of the comparison between the upper-limit comparison voltage UCV and the reference voltage RV1 and the result of the comparison between the lower-limit comparison voltage LCV and the reference voltage RV1. The evaluation voltage setting value output circuit 7 changes a ratio K1 between the power supply voltage PSV and the upper-limit comparison voltage UCV, and a ratio K2 between the power supply voltage PSV and the lower-limit comparison voltage LCV based on the result of the evaluation of the power supply voltage PSV.

According to this embodiment, it is possible to increase the number of expected voltage levels, which are compared with the power supply voltage PSV, without increasing the number of comparators. This is because the ratio K1 between the power supply voltage PSV and the upper-limit comparison voltage UCV and the ratio K2 between the power supply voltage PSV and the lower-limit comparison voltage LCV are changed based on the result of the comparison between the upper-limit comparison voltage UCV and the reference voltage RV1 and the result of the comparison result between the lower-limit comparison voltage LCV and the reference voltage RV1. Therefore, it is possible to lower the probability of an accidental match between the transition of the power supply voltage PSV and the expected voltage transition while minimizing the increase in the circuit size of the power supply voltage transition comparison circuit 20A. Therefore, it is possible to prevent an outsider who does not know the expected voltage transition from illegitimately generating the lock cancellation signal LCS. Further, since the increase in the circuit size is minimized, the increase in the current consumption is also minimized.

Next, a configuration of the power supply voltage transition comparison circuit 20A is explained in detail.

The power supply voltage transition comparison circuit 20A includes a power supply to be monitored 1, a BGR (Band Gap Reference) circuit 2, a comparator 3, a comparator 4, a comparator evaluation voltage setting circuit 5, an AND-gate having an inverter 6, an evaluation voltage setting value output circuit 7, a voltage evaluation circuit 8, and a voltage evaluation control circuit 9.

The power supply to be monitored 1 (hereinafter called "monitored power supply 1") is, for example, a power supply terminal of a semiconductor circuit in which the power supply voltage transition comparison circuit 20A is provided. The monitored power supply 1 outputs a power supply voltage PSV to the BGR circuit 2 and the comparator evaluation voltage setting circuit 5. The BGR circuit 2 is a reference voltage generation circuit that generates a reference voltage RV1 from the power supply voltage PSV. The BGR circuit 2 keeps the reference voltage RV1 at a predetermined fixed voltage even when the power supply voltage PSV fluctuates. The BGR circuit 2 outputs the reference voltage RV1 to +input terminals of the comparators 3 and 4.

The comparator evaluation voltage setting circuit 5 includes resistance voltage-dividing circuits 12 and 13. The resistance voltage-dividing circuit 12 generates an upper-limit comparison voltage UCV from the power supply voltage PSV and outputs the upper-limit comparison voltage UCV to a −input terminal of the comparator 3. The resistance voltage-dividing circuit 13 generates a lower-limit comparison voltage LCV from the power supply voltage PSV and outputs the lower-limit comparison voltage LCV to a −input terminal of the comparator 4. The upper-limit comparison voltage UCV and the lower-limit comparison voltage LCV are divided voltages of the power supply voltage PSV. The comparator evaluation voltage setting circuit 5 sets a ratio K1 between the power supply voltage PSV and the upper-limit comparison voltage UCV and a ratio K2 between the power supply voltage PSV and the lower-limit comparison voltage LCV at the same time based on an evaluation voltage setting signal DVS. Note that the evaluation voltage setting signal DVS indicates the upper-limit voltage and the lower-limit voltage of an expected voltage range.

The comparator evaluation voltage setting circuit 5 sets the resistance value of the resistance voltage-dividing circuit 12 and thereby sets the ratio K1 so that when the power supply voltage PSV matches the upper-limit voltage, the upper-limit comparison voltage UCV matches the reference voltage RV1. Further, the comparator evaluation voltage setting circuit 5 sets the resistance value of the resistance voltage-dividing circuit 13 and thereby sets the ratio K2 so that when the power supply voltage PSV matches the lower-limit voltage, the lower-limit comparison voltage LCV matches the reference voltage RV1. When the upper-limit voltage and the lower-limit voltage indicated by the evaluation voltage setting signal DVS change, the comparator evaluation voltage setting circuit 5 changes the ratios K1 and K2 so that they conform to the new upper-limit voltage and lower-limit voltage.

The comparator 3 performs a voltage upper-limit comparison. The comparator 3 compares the reference voltage RV1 input to the +input terminal with the upper-limit comparison voltage UCV input to the −input terminal and outputs a comparator output signal UCO, which is a digital signal indicating the comparison result, to an inverter-side input terminal of the AND-gate having an inverter 6 (hereinafter called "inverter-equipped AND-gate 6"). The comparator output signal UCO is at a low level when the upper-limit comparison voltage UCV is lower than the reference voltage RV1. Further, the comparator output signal UCO is at a high level when the upper-limit comparison voltage UCV is higher than the reference voltage RV1. In other words, when the power supply voltage PSV is lower than the upper-limit voltage indicated by the evaluation voltage setting signal DVS, the comparator output signal UCO is at a low level, whereas when the power supply voltage PSV is higher than the upper-limit voltage indicated by the evaluation voltage setting signal DVS, the comparator output signal UCO is at a high level.

The comparator 4 performs a voltage lower-limit comparison. The comparator 4 compares the reference voltage RV1 input to the +input terminal with the lower-limit comparison voltage LCV input to the −input terminal and outputs a comparator output signal LCO, which is a digital signal indicating the comparison result, to the other input terminal of the inverter-equipped AND-gate 6. The comparator output signal LCO is at a low level when the lower-limit comparison voltage LCV is lower than the reference voltage RV1. Further, the comparator output signal LCO is at a high level when the lower-limit comparison voltage LCV is higher than the reference voltage RV1. In other words, when the power supply voltage PSV is lower than the lower-limit voltage indicated by the evaluation voltage setting signal DVS, the comparator output signal LCO is at a low level, whereas when the power supply voltage PSV is higher than the lower-limit voltage indicated by the evaluation voltage setting signal DVS, the comparator output signal LCO is at a high level.

The inverter-equipped AND-gate 6 outputs a logic gate output signal LGO to the voltage evaluation circuit 8 based on the comparator output signals UCO and LCO. The logic gate output signal LGO is at a high level when the comparator output signal UCO is at a low level and the comparator output signal LCO is at a high level. Further, the logic gate output signal LGO is at a low level in the other cases. That is, when the power supply voltage PSV is between the upper-limit voltage and the lower-limit voltage indicated by the evaluation voltage setting signal DVS, the logic gate output signal LGO is at a high level, whereas when the power supply voltage PSV is not between the upper-limit voltage and the lower-limit voltage, the logic gate output signal LGO is at a low level.

When the voltage evaluation circuit 8 receives a voltage evaluation implementation instruction signal VDC from the voltage evaluation control circuit 9, the voltage evaluation circuit 8 determines whether or not the power supply voltage PSV is within the expected voltage range and outputs a voltage evaluation result signal VDR indicating the evaluation result to the voltage evaluation control circuit 9. When the logic gate output signal LGO is at a high level, the voltage evaluation circuit 8 determines that the power supply voltage PSV is within the expected voltage range. When the logic gate output signal LGO is at a low level, the voltage evaluation circuit 8 determines that the power supply voltage PSV is outside the expected voltage range.

The voltage evaluation control circuit 9 controls the overall sequence for determining whether or not the transition of the power supply voltage PSV matches an expected voltage transition. The voltage evaluation control circuit 9 includes an evaluation step counter 10 and a WAIT counter 11. The evaluation step counter 10 counts the number of evaluation steps. The voltage evaluation control circuit 9 outputs an evaluation step number signal DSN indicating the count value of the evaluation step counter 10 (evaluation step number) to the evaluation voltage setting value output circuit 7. A plurality of count values that the evaluation step counter 10 can take correspond to a plurality of respective evaluation steps. Further, the voltage evaluation control circuit 9 secures a wait time (WAIT time) between evaluation steps by using the WAIT counter 11.

The evaluation voltage setting value output circuit 7 holds a plurality of setting value groups associated with the plurality of respective count values. Each setting value group includes an upper-limit voltage and a lower-limit voltage of an expected voltage range. The evaluation voltage setting value output circuit 7 conveys the upper-limit voltage and the lower-limit voltage of an expected voltage range corresponding to a count value indicated by the evaluation step number signal DSN to the comparator evaluation voltage setting circuit 5 by outputting an evaluation voltage setting signal DVS.

According to this embodiment, since the lock cancellation signal LCS is generated based on the transition of the power supply voltage PSV, it is unnecessary to provide a dedicated terminal for generating the lock cancellation signal LCS. Further, since the reference voltage RV1 is generated from the power supply voltage PSV, it is unnecessary to provide a dedicated power supply for generating the reference voltage RV1. Further, by providing the two comparators 3 and 4, the upper-limit voltage evaluation and the lower-limit voltage evaluation can be simultaneously performed. As a result, the time required for the comparisons is reduced.

Figure 2:
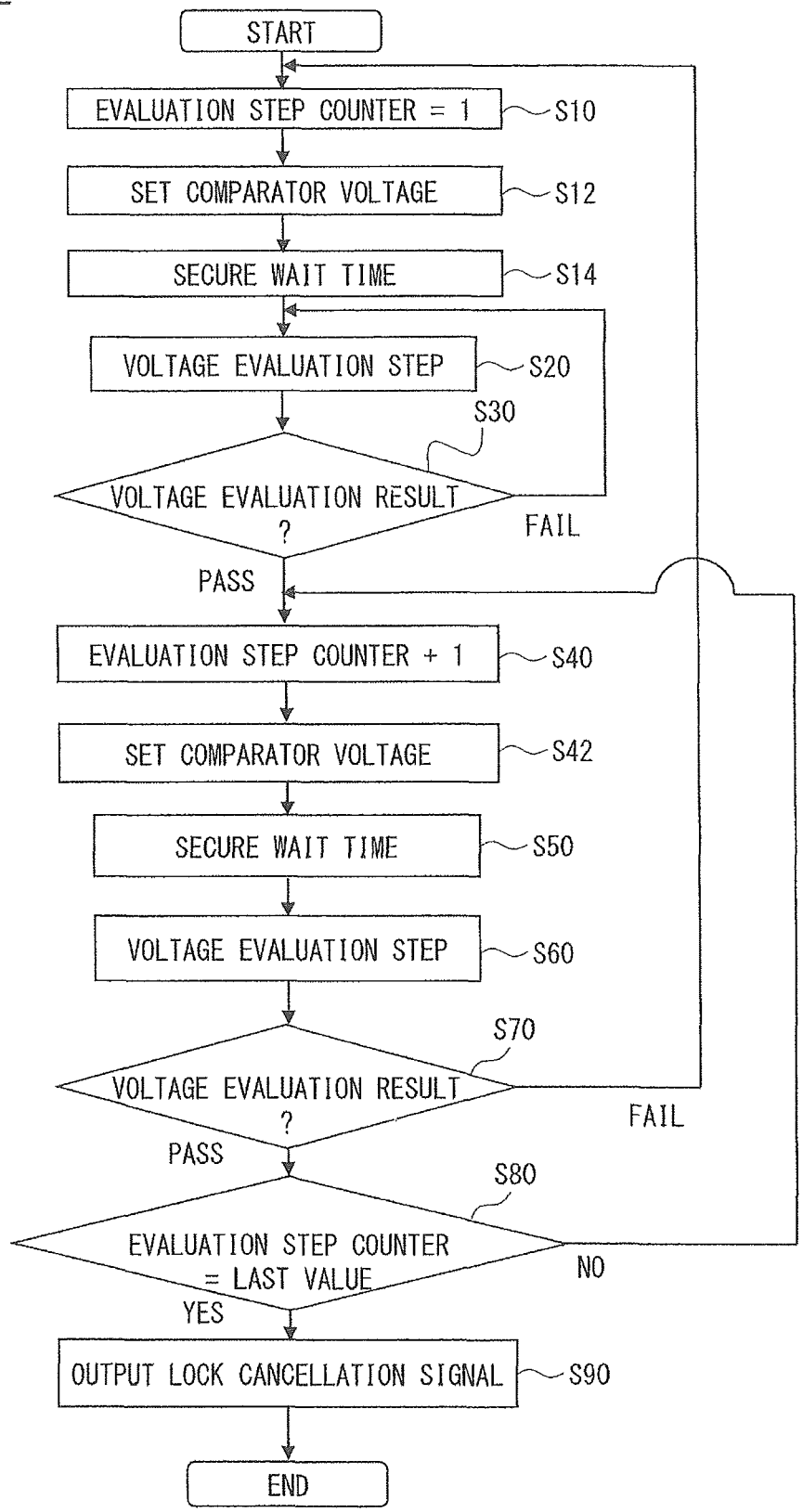
FIG. 2 is a flowchart showing an operation of the power supply voltage transition comparison circuit according to the first embodiment.

FIG. 2 is a flowchart showing an operation of the power supply voltage transition comparison circuit 20A. The power supply voltage transition comparison circuit 20A repeats the evaluation step while changing the ratio K1 between the power supply voltage PSV and the upper-limit comparison voltage UCV and the ratio K2 between the power supply voltage PSV and the lower-limit comparison voltage LCV, and thereby determines whether or not the transition of the power supply voltage PSV matches the expected voltage transition. The evaluation step includes generating an upper-limit comparison voltage UCV and a lower-limit comparison voltage LCV from the power supply voltage PSV, comparing the upper-limit comparison voltage UCV with the reference voltage RV1, comparing the lower-limit comparison voltage LCV with the reference voltage RV1, and determining whether or not the power supply voltage PSV matches a predetermined expected voltage based on the comparison results. When the power supply voltage PSV matches the predetermined expected voltage, the power supply voltage transition comparison circuit 20A performs the next evaluation step.

Next, an operation of the power supply voltage transition comparison circuit 20A is explained in detail. When the voltage evaluation control circuit 9 receives a trigger signal TS indicating the start of a power supply voltage transition comparison, the process proceeds to a step S10. The trigger signal TS is, for example, a reset cancellation signal or an instruction from a CPU (Central Processing Unit) (not shown).
(Step S10)

The voltage evaluation control circuit 9 initializes the count value of the evaluation step counter 10 to one. Further, the voltage evaluation control circuit 9 outputs an evaluation step number signal DSN to the evaluation voltage setting value output circuit 7 and thereby conveys the count value of the evaluation step counter 10 to the evaluation voltage setting value output circuit 7.
(Step S12)

The evaluation voltage setting value output circuit 7 outputs an evaluation voltage setting signal DVS to the comparator evaluation voltage setting circuit 5 and thereby conveys a setting value group (upper-limit voltage and lower-limit voltage of an expected voltage range) associated with the count value indicated by the evaluation step number signal DSN to the comparator evaluation voltage setting circuit 5. The comparator evaluation voltage setting circuit 5 sets the resistance values of the resistance voltage-dividing circuits 12 and 13 based on the evaluation voltage setting signal DVS and thereby sets the ratios K1 and K2. As a result, an upper-limit comparison voltage UCV is set so that when the power supply voltage PSV matches the upper-limit voltage indicated by the evaluation voltage setting signal DVS, the upper-limit comparison voltage UCV matches the reference voltage RV1. Further, a lower-limit comparison voltage LCV is set so that when the power supply voltage PSV matches the lower-limit voltage indicated by the evaluation voltage setting signal DVS, the lower-limit comparison voltage LCV matches the reference voltage RV1.
(Step S14)

The WAIT counter 11 of the voltage evaluation control circuit 9 measures an elapsed time from when the evaluation step number signal DSN indicating the count value of the evaluation step counter 10 is output in the step S10. The WAIT counter 11 measures the elapsed time by, for example, counting a clock. The voltage evaluation control circuit 9 does not output a voltage evaluation implementation instruction signal VDC for indicating the implementation of a voltage evaluation to the voltage evaluation circuit 8 until the elapsed time reaches a predetermined wait time. By doing so, the voltage evaluation control circuit 9 secures a wait time for reflecting the upper-limit voltage and the lower-limit voltage, which are used as setting values, in the comparators 3 and 4.
(Step S20)

The resistance voltage-dividing circuit 12 generates the upper-limit comparison voltage UCV from the power supply voltage PSV and the resistance voltage-dividing circuit 13 generates the lower-limit comparison voltage LCV from the power supply voltage PSV. The comparator 3 compares the upper-limit comparison voltage UCV with the reference voltage RV1 and outputs a comparator output signal UCO indicating the comparison result. The comparator 4 compares the lower-limit comparison voltage LCV with the reference voltage RV1 and outputs a comparator output signal LCO indicating the comparison result. The inverter-equipped AND-gate 6 outputs a logic gate output signal LGO based on the comparator output signals UCO and LCO.

The voltage evaluation control circuit 9 instructs the voltage evaluation circuit 8 to carry out a voltage evaluation by outputting a voltage evaluation implementation instruction signal VDC to the voltage evaluation circuit 8. Upon receiving the voltage evaluation implementation instruction signal VDC, the voltage evaluation circuit 8 evaluates the power supply voltage PSV. When the logic gate output signal LGO is at a high level, the voltage evaluation circuit 8 determines that the power supply voltage PSV is within the expected voltage range and thereby determines that the power supply voltage PSV matches the expected voltage. When the logic gate output signal LGO is at a low level, the voltage evaluation circuit 8 determines that the power supply voltage PSV is outside the expected voltage range and thereby determines that the power supply voltage PSV does not match the expected voltage. When the logic gate output signal LGO is at a high level, the voltage evaluation circuit 8 notifies the voltage evaluation control circuit 9 that the voltage evaluation result is "PASS" by using a voltage evaluation result signal VDR. Further, when the logic gate output signal LGO is at a low level, the voltage evaluation circuit 8 notifies the voltage evaluation control circuit 9 that the voltage evaluation result is "FAIL" using the voltage evaluation result signal VDR.
(Step S30)

When the voltage evaluation result is "FAIL" in the step S20, the process returns to the step S20. When the voltage evaluation result is "PASS" in the step S20, the process proceeds to the step S40.
(Step S40)

When the voltage evaluation result is "PASS", the voltage evaluation control circuit 9 updates (increments) the count value of the evaluation step counter 10. In other words, the evaluation step counter 10 counts the number of evaluation steps based on the result of the evaluation of the power supply voltage PSV output from the voltage evaluation circuit 8. The voltage evaluation control circuit 9 notifies the evaluation voltage setting value output circuit 7 of the updated count value by outputting an evaluation step number signal DSN to the evaluation voltage setting value output circuit 7.
(Step S42)

The evaluation voltage setting value output circuit 7 changes the evaluation voltage setting signal DVS based on the value of the evaluation step number signal DSN. Specifically, the evaluation voltage setting value output circuit 7 outputs an evaluation voltage setting signal DVS indicating setting values (upper-limit voltage and lower-limit voltage of an expected voltage range) associated with the updated count value indicated by the evaluation step number signal DSN. The comparator evaluation voltage setting circuit 5 changes the resistance values of the resistance voltage-dividing circuits 12 and 13 based on the value of the evaluation voltage setting signal DVS. Specifically, the comparator evaluation voltage setting circuit 5 sets the resistance values of the resistance voltage-dividing circuits 12 and 13 based on setting values associated with the updated count value. In other words, the evaluation voltage setting value output circuit 7 sets the ratios K1 and K2 based on the setting values associated with the updated count value.
(Step S50)

The WAIT counter 11 of the voltage evaluation control circuit 9 measures an elapsed time from when the evaluation step number signal DSN indicating the updated count value of the evaluation step counter 10 is output in the step S40. The voltage evaluation control circuit 9 does not output the voltage evaluation implementation instruction signal VDC to the voltage evaluation circuit 8 until the elapsed time reaches the predetermined wait time. By doing so, the voltage evaluation control circuit 9 secures a wait time before the next voltage evaluation step. By this wait time, the time for changing the power supply voltage PSV and the setup time for reflecting the upper-limit voltage and the lower-limit voltage corresponding to the updated count value in the comparators 3 and 4 are secured.

(Steps S60 and S70)

The power supply voltage transition comparison circuit 20A performs a voltage evaluation through an operation similar to that in the step S20 (step S60). When the voltage evaluation result is "FAIL" in the step S60, the process returns to the step S10, whereas when the voltage evaluation result is "PASS" in the step S60, the process proceeds to the step S80 (step S70).

(Step S80)

The voltage evaluation control circuit 9 determines whether the count value of the evaluation step counter 10 is the last value or not based on an overflow flag of the evaluation step counter 10. When the count value of the evaluation step counter 10 is the last value, that is, when the count value is equal to the upper limit value for the evaluation step number, the voltage evaluation control circuit 9 determines that the transition of the power supply voltage PSV matches the expected voltage transition and hence the process proceeds to a step S90. When the count value of the evaluation step counter 10 is not the last value, the process returns to the step S40.

(Step S90)

The voltage evaluation control circuit 9 outputs a lock cancellation signal LCS indicating the cancellation of the lock of a circuit to which access is protected (which is described later). In response to the lock cancellation signal LCS, the lock of the circuit to which access is protected (hereinafter called "access-protected circuit") is cancelled and the semiconductor integrated circuit in which the access-protected circuit is provided is changed to a test mode.

Note that although the evaluation step counter 10 is an up-counter in the above explanation, a down-counter may be used as the evaluation step counter 10.

Figure 3:
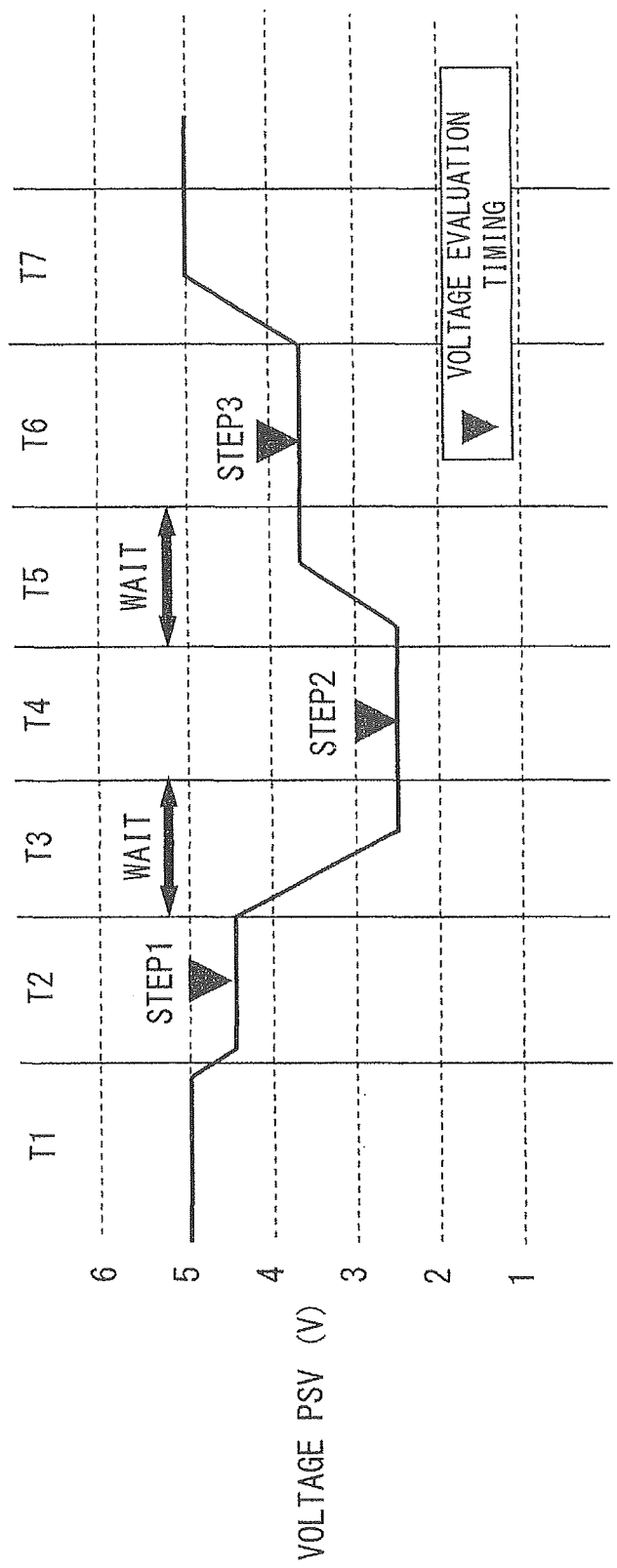
FIG. 3 is a timing chart showing an operation of the power supply voltage transition comparison circuit according to the first embodiment and a transition of a power supply voltage to be monitored.

FIG. 3 is a timing chart showing an operation of the power supply voltage transition comparison circuit 20A and a transition of the power supply voltage PSV. A user possesses information about a plurality of setting value groups associated with a plurality of respective voltage evaluation steps and a wait time(s) between the voltage evaluation steps. Note that each setting value group includes an upper-limit voltage and a lower-limit voltage of an expected voltage range. A power supply voltage supply apparatus (not shown) used by the user changes the power supply voltage PSV as shown in FIG. 3. The power supply voltage supply apparatus controls the voltage level of the power supply voltage PSV based on the plurality of setting value groups and controls the transition timing of the power supply voltage PSV based on the timing of a trigger signal TS and the wait time between voltage evaluation steps. In the example shown in FIG. 3, the number of voltage evaluation steps is three. The three voltage evaluation steps correspond to the steps 1 to 3.

In a section T1, the power supply voltage transition comparison circuit 20A performs the operations in the steps S10, S12 and S14. The power supply voltage transition comparison circuit 20A initializes the count value of the evaluation step counter 10 to one in response to the trigger signal TS, and sets the resistance values of the resistance voltage-dividing circuits 12 and 13 based on the upper-limit voltage and the lower-limit voltage for the step 1, which is the first step. In this example, the upper-limit voltage and the lower-limit voltage for the step 1 are 5.0V and 4.0V, respectively. Meanwhile, the power supply voltage supply apparatus changes the power supply voltage PSV from the normal voltage 5.0V to a voltage between the upper-limit voltage and the lower-limit voltage for the step 1 (for example, 4.5V) in response to the trigger signal TS. Note that the illustration of the wait time in the step S14 is omitted in the figure.

In a section T2, the power supply voltage transition comparison circuit 20A performs the operations in the steps S20 and S30. The power supply voltage transition comparison circuit 20A performs a voltage evaluation of the step 1 and determines that the power supply voltage PSV is between the upper-limit voltage 5.0V and the lower-limit voltage 4.0V. Meanwhile, the power supply voltage supply apparatus keeps the power supply voltage PSV between the upper-limit voltage and the lower-limit voltage for the step 1.

In a section T3, the power supply voltage transition comparison circuit 20A performs the operations in the steps S40, S42 and S50. The voltage evaluation control circuit 9 increments the count value of the evaluation step counter 10 to two. The comparator evaluation voltage setting circuit 5 changes the resistance values of the resistance voltage-dividing circuits 12 and 13 and sets them to resistance values corresponding to the upper-limit voltage and the lower-limit voltage for the step 2. The upper-limit voltage and the lower-limit voltage for the step 2 are 3.0V and 2.0V, respectively. Meanwhile, the power supply voltage supply apparatus changes the power supply voltage PSV from the voltage between the upper-limit voltage and the lower-limit voltage for the step 1 to a voltage between the upper-limit voltage and the lower-limit voltage for the step 2 (for example, 2.5V). The wait time in the step S50 secures the time for changing the power supply voltage PSV and the setup time for reflecting the upper-limit voltage and the lower-limit voltage for the step 2 in the comparators 3 and 4.

In a section T4, the power supply voltage transition comparison circuit 20A performs the operations in the steps S60 and S70. The power supply voltage transition comparison circuit 20A performs a voltage evaluation of the step 2 and determines that the power supply voltage PSV is between the upper-limit voltage 3.0V and the lower-limit voltage 2.0V. Meanwhile, the power supply voltage supply apparatus keeps the power supply voltage PSV between the upper-limit voltage and the lower-limit voltage for the step 2.

In a section T5, the power supply voltage transition comparison circuit 20A performs the operations in the steps S40, S42 and S50. The voltage evaluation control circuit 9 increments the count value of the evaluation step counter 10 to three. The comparator evaluation voltage setting circuit 5 changes the resistance values of the resistance voltage-dividing circuits 12 and 13 and sets them to resistance values corresponding to the upper-limit voltage and the lower-limit voltage for the step 3. The upper-limit voltage and the lower-limit voltage for the step 3 are 4.0V and 3.0V, respectively. Meanwhile, the power supply voltage supply apparatus changes the power supply voltage PSV from the voltage between the upper-limit voltage and the lower-limit voltage for the step 2 to a voltage between the upper-limit voltage and the lower-limit voltage for the step 3 (for example, 3.5V). The wait time in the step S50 secures the time for changing the power supply voltage PSV and the setup time for reflecting the upper-limit voltage and the lower-limit voltage for the step 3 in the comparators 3 and 4.

In a section T6, the power supply voltage transition comparison circuit 20A performs the operations in the steps S60, S70, S80 and S90. The power supply voltage transition comparison circuit 20A performs a voltage evaluation of the step 3 and determines that the power supply voltage PSV is between the upper-limit voltage 4.0V and the lower-limit voltage 3.0V. Since the step 3 is the last step, the voltage evaluation control circuit 9 outputs a lock cancellation signal LCS. Meanwhile, the power supply voltage supply apparatus keeps the power supply voltage PSV between the upper-limit voltage and the lower-limit voltage for the step 3.

In a section T7, the power supply voltage supply apparatus returns the power supply voltage PSV to the normal voltage 5.0V.

Note that the control method for the power supply voltage transition comparison circuit 20A performed by the voltage evaluation control circuit 9 may be implemented by a computer that runs based on a computer program. The control method includes outputting an evaluation step number signal DSN indicating a count value to the evaluation voltage setting value output circuit 7, outputting a voltage evaluation implementation instruction signal VDC to the voltage evaluation circuit 8, and updating the count value based on a voltage evaluation result signal VDR.

Note that the comparator evaluation voltage setting circuit 5 generates the upper-limit comparison voltage UCV and the lower-limit comparison voltage LCV as divided voltages of the power supply voltage PSV. The comparator 3 compares the upper-limit comparison voltage UCV with the reference voltage RV1. The comparator 4 compares the lower-limit comparison voltage LCV with the reference voltage RV1. When the voltage evaluation circuit 8 receives the voltage evaluation implementation instruction signal VDC, the voltage evaluation circuit 8 evaluates the power supply voltage PSV based on the comparator output signals UCO and LCO output by the comparators 3 and 4 and outputs a voltage evaluation result signal VDR indicating the evaluation result. The evaluation voltage setting value output circuit 7 sets a ratio K1 between the power supply voltage PSV and the upper-limit comparison voltage UCV and a ratio K2 between the power supply voltage PSV and the lower-limit comparison voltage LCV based on a predetermined setting value(s) associated with the value of the evaluation step number signal DSN.

The control method may include securing a predetermined wait time from when the evaluation step number signal DSN is output to when the voltage evaluation implementation instruction signal VDC is output. The control method may include outputting a lock cancellation signal LCS indicating the cancellation of the lock of an access-protected circuit when the count value is the last value and the voltage evaluation result signal VDR indicates that the power supply voltage PSV is within a predetermined expected voltage range.

Modified Example of First Embodiment

Next, a modified example of the first embodiment is explained.

Figure 4:
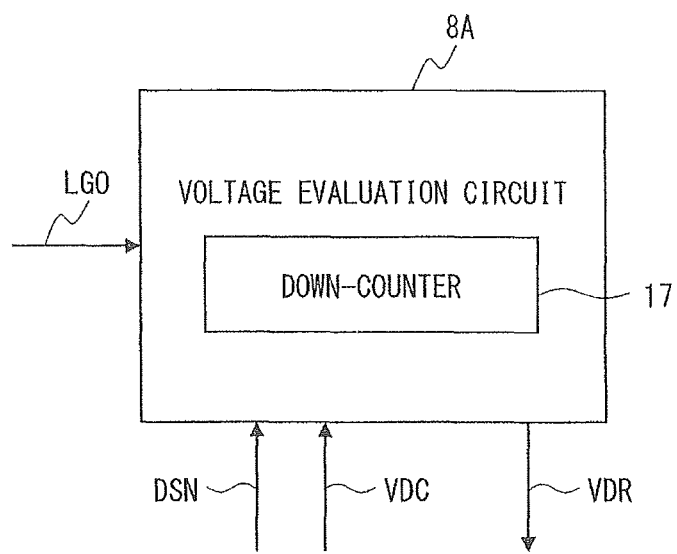
FIG. 4 is a schematic diagram of a voltage evaluation circuit according to a modified example of the first embodiment.

Referring to FIG. 4, a power supply voltage transition comparison circuit 20A according to this modified example includes a voltage evaluation circuit 8A in place of the voltage evaluation circuit 8. The operation of the voltage evaluation circuit 8A in the step S20 is different from that of the voltage evaluation circuit 8 in the step S20. The operation of the voltage evaluation circuit 8A in the step S60 is the same as that of the voltage evaluation circuit 8 in the step S60. Further, the step S30 in this modified example is different from that in the first embodiment.

An operation of the voltage evaluation circuit 8A performed in the step S20 is explained. When the voltage evaluation circuit 8A receives a voltage evaluation implementation instruction signal VDC, the voltage evaluation circuit 8A evaluates the power supply voltage PSV. When the logic gate output signal LGO is at a high level, the voltage evaluation circuit 8A notifies the voltage evaluation control circuit 9 that the voltage evaluation result is "PASS" by using a voltage evaluation result signal VDR. When the logic gate output signal LGO is at a low level, the voltage evaluation circuit 8A performs a voltage evaluation in each cycle of the operation clock and thereby repeatedly performs the voltage evaluation. If the logic gate output signal LGO does not become a high level even after repeating the voltage evaluation a predetermined number of times, the voltage evaluation circuit 8A notifies the voltage evaluation control circuit 9 that the voltage evaluation result is "FAIL" by using a voltage evaluation result signal VDR.

The power supply voltage transition comparison circuit 20A is explained in a more detailed manner. The voltage evaluation circuit 8A acquires the count value of the evaluation step counter 10 through the evaluation step number signal DSN. When the voltage evaluation circuit 8A receives a voltage evaluation implementation instruction signal VDC when the evaluation step counter 10 has the initial value, the voltage evaluation circuit 8A repeats the voltage evaluation until the voltage evaluation circuit 8A detects a high-level logic gate output signal LGO or the number of voltage evaluations reaches a predetermined number.

The voltage evaluation circuit 8A includes a down-counter 17 that counts the number of voltage evaluations in a descending manner. The voltage evaluation circuit 8A repeats the voltage evaluation until the count value of the down-counter 17 becomes zero. When the voltage evaluation circuit 8A receives a voltage evaluation implementation instruction signal VDC, the voltage evaluation circuit 8A initializes the down-counter 17. For example, when the voltage evaluation is to be repeated ten times, the down-counter 17 is initialized to ten. Alternatively, a CPU (not shown) may set an arbitrary value in the down-counter 17 before the voltage evaluation is started.

When the voltage evaluation control circuit 9 receives a voltage evaluation result signal VDR indicating that the voltage evaluation result is "FAIL" when the evaluation step counter 10 has the initial value (FAIL at step S30), the process returns to the start (trigger signal TS waiting state) in FIG. 2. Note that the number of voltage evaluations may be counted by using an up-counter instead of the down-counter 17. The number of voltage evaluations performed by the voltage evaluation circuit 8A in the step S20 does not necessarily have to be restricted to any particular number.

Second Embodiment

Figure 5:
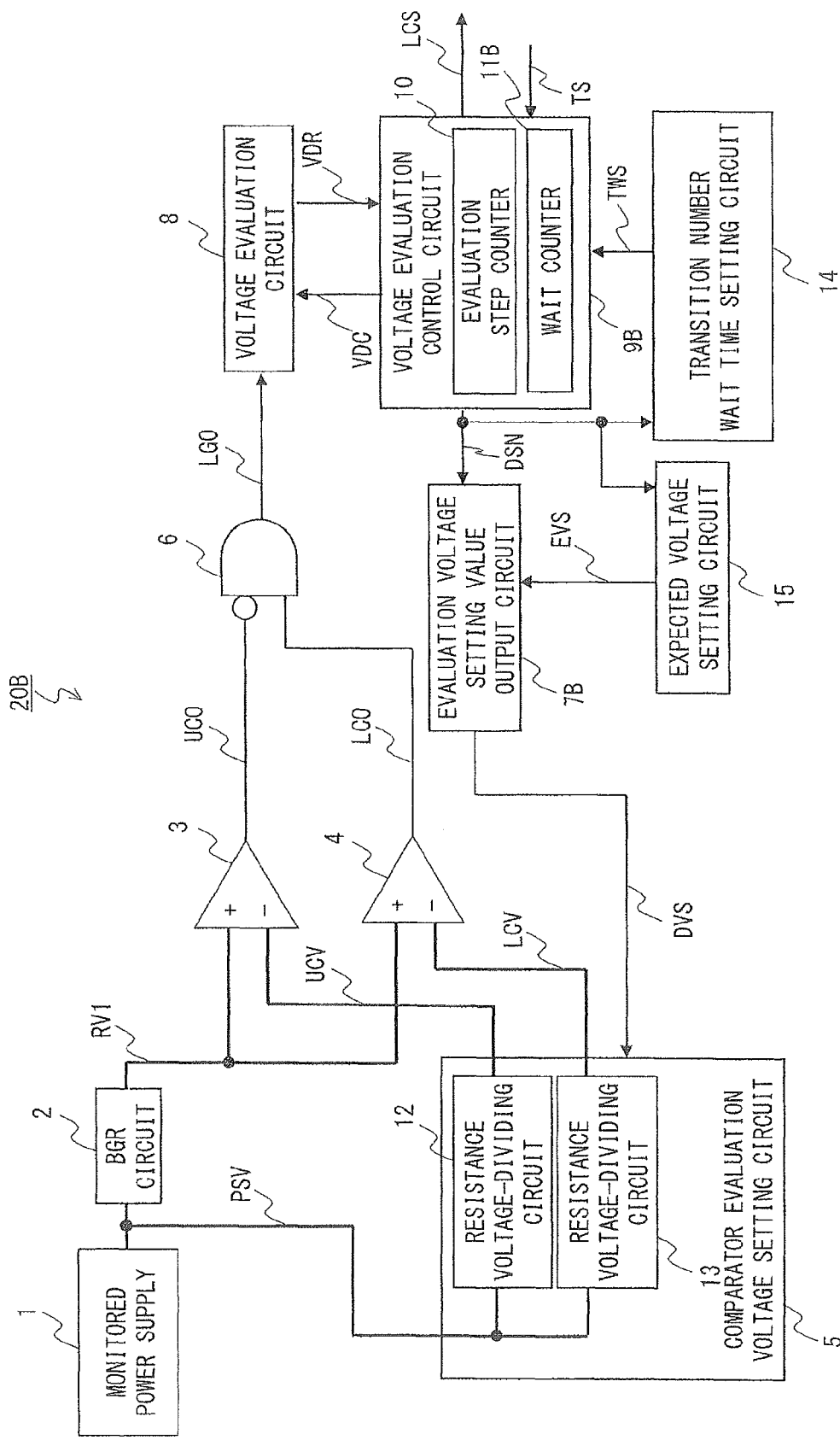
FIG. 5 is a circuit configuration diagram of a power supply voltage transition comparison circuit according to a second embodiment.

FIG. 5 is a circuit configuration diagram of a power supply voltage transition comparison circuit 20B according to a second embodiment. The power supply voltage transition comparison circuit 20B is different from the power supply voltage transition comparison circuit 20A in that the power supply voltage transition comparison circuit 20B includes a transition number WAIT time setting circuit 14 and an expected voltage setting circuit 15 as additional components. Further, the power supply voltage transition comparison circuit 20B includes an evaluation voltage setting value output circuit 7B in place of the evaluation voltage setting value output circuit 7 of the power supply voltage transition comparison circuit 20A and includes a voltage evaluation control circuit 9B in place of the voltage evaluation control circuit 9 of the circuit 20A. The voltage evaluation control circuit 9B includes an evaluation step counter 10 and a WAIT counter 11B. The transition number WAIT time setting circuit 14 outputs a transition number WAIT time setting signal TWS to the voltage evaluation control circuit 9B based on the evaluation step number signal DSN. The expected voltage setting circuit 15 outputs an expected voltage setting signal EVS to the evaluation voltage setting value output circuit 7B based on the evaluation step number signal DSN.

FIG. 6 is a table held by the transition number WAIT time setting circuit 14. The transition number WAIT time setting circuit 14 holds WAIT count values which are associated with values for the evaluation step number signal DSN. The transition number WAIT time setting circuit 14 can change the held WAIT count values. The transition number WAIT time setting circuit 14 needs to hold at least the evaluation step number (voltage transition number) and the WAIT time. For example, the transition number WAIT time setting circuit 14 can store the WAIT count values in a non-volatile memory. The WAIT count values are setting values for the expected voltage transition.

FIG. 7 is a table held by the expected voltage setting circuit 15. The expected voltage setting circuit 15 holds values for the upper-limit voltage and the lower-limit voltage which are associated with values for the evaluation step number signal DSN. The expected voltage setting circuit 15 can change the values for the upper-limit voltage and lower-limit voltage held therein. The expected voltage setting circuit 15 needs to hold at least the expected voltage range. For example, the expected voltage setting circuit 15 can store the values for the upper-limit voltage and lower-limit voltage in a non-volatile memory. The values for the upper-limit voltage and lower-limit voltage are setting values for the expected voltage transition.

FIGS. 6 and 7 show example structures for tables for a case where the number of evaluation steps (number of voltage transitions) can be arbitrarily set in a range from 1 to 7. The values in the tables in FIGS. 6 and 7 are example values for a case where the number of evaluation steps (number of voltage transitions) is three.

A user sets the number of evaluation steps and a WAIT time(s) between evaluation steps in the transition number WAIT time setting circuit 14 and sets an expected voltage range for each evaluation step in the expected voltage setting circuit 15 before starting the power supply voltage transition comparison. Specifically, when the number of evaluation steps is set to three, the user sets, for the transition number WAIT time setting circuit 14, values greater than zero as WAIT count values corresponding to the values 1 to 3 for the evaluation step number signal DSN, and sets zero as WAIT count values corresponding to the values 4 to 7 for the evaluation step number signal DSN. The WAIT count value that is greater than zero corresponds to the length of the WAIT time. The user sets values of the upper-limit voltage and the lower-limit voltage corresponding to the values of the evaluation step number signal DSN.

Figure 8:
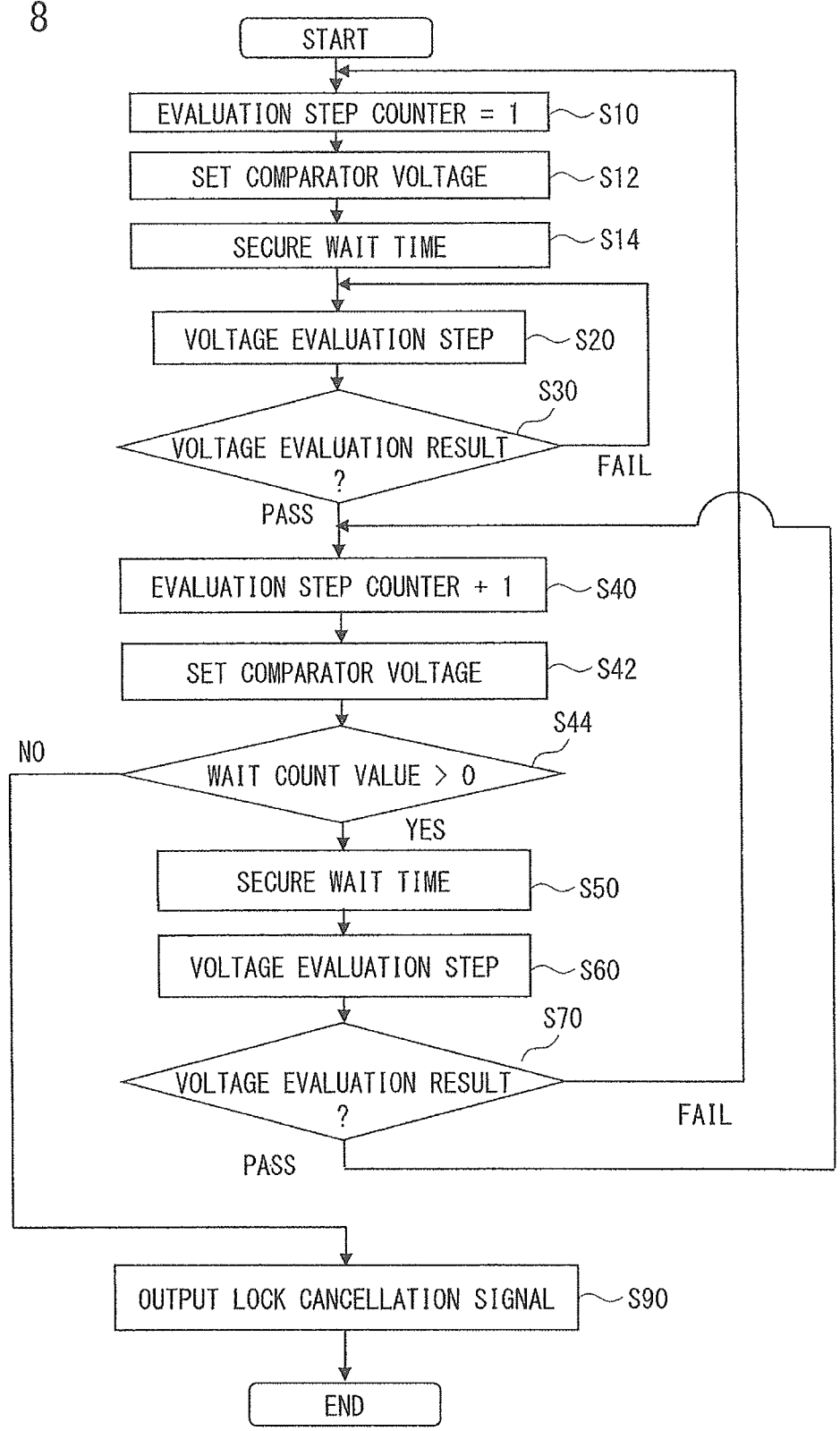
FIG. 8 is a flowchart showing an operation of the power supply voltage transition comparison circuit according to the second embodiment.

Next, an operation of the power supply voltage transition comparison circuit 20B is explained with reference to FIG. 8. When the voltage evaluation control circuit 9B receives a trigger signal TS indicating the start of a power supply voltage transition comparison, the process proceeds to a step S10.
(Step S10)

The voltage evaluation control circuit 9B initializes the count value of the evaluation step counter 10 to one, and outputs an evaluation step number signal DSN to the evaluation voltage setting value output circuit 7B, the transition number WAIT time setting circuit 14, and the expected voltage setting circuit 15 and thereby conveys the count value of the evaluation step counter 10 to them. The transition number WAIT time setting circuit 14 outputs a transition number WAIT time setting signal TWS to the voltage evaluation control circuit 9B and thereby conveys a WAIT count value corresponding to the value of the evaluation step number signal DSN to the voltage evaluation control circuit 9B. The expected voltage setting circuit 15 outputs an expected voltage setting signal EVS to the evaluation voltage setting value output circuit 7B and thereby conveys the values of the upper-limit voltage and the lower-limit voltage corresponding to the value of the evaluation step number signal DSN to the evaluation voltage setting value output circuit 7B.
(Step S12)

The evaluation voltage setting value output circuit 7B outputs an evaluation voltage setting signal DVS to the comparator evaluation voltage setting circuit 5 and thereby conveys the upper-limit voltage and the lower-limit voltage corresponding to the value of the evaluation step number signal DSN to the comparator evaluation voltage setting circuit 5. The comparator evaluation voltage setting circuit 5 sets the resistance values of the resistance voltage-dividing circuits 12 and 13 based on the evaluation voltage setting signal DVS and thereby sets the ratios K1 and K2.
(Step S14)

The WAIT counter 11B of the voltage evaluation control circuit 9B counts a clock up to the WAIT count value conveyed from the transition number WAIT time setting circuit 14 in the step S10, and thereby secures a wait time. The voltage evaluation control circuit 9B does not output the voltage evaluation implementation instruction signal VDC for indicating the implementation of a voltage evaluation to the voltage evaluation circuit 8 until the wait time has elapsed.
(Steps S20 and S30)

The step S20 according to this embodiment is the same as the step S20 according to the first embodiment. However, the voltage evaluation control circuit 9 of the first embodiment is replaced in this embodiment by the voltage evaluation control circuit 9B. The step S30 according to this embodiment is the same as the step S30 according to the first embodiment.
(Step S40)

When the voltage evaluation result is "PASS", the voltage evaluation control circuit 9B updates (increments) the count value of the evaluation step counter 10. The voltage evaluation control circuit 9B outputs an evaluation step number signal DSN to the evaluation voltage setting value output circuit 7B, the transition number WAIT time setting circuit 14, and the expected voltage setting circuit 15, and thereby conveys the count value of the evaluation step counter 10 to them. The transition number WAIT time setting circuit 14 outputs a transition number WAIT time setting signal TWS to the voltage evaluation control circuit 9B and thereby conveys a WAIT count value corresponding to the value of the evaluation step number signal DSN to the voltage evaluation control circuit 9B. The expected voltage setting circuit 15 outputs an expected voltage setting signal EVS to the evaluation voltage setting value output circuit 7B and thereby conveys the values of the upper-limit voltage and the lower-limit voltage corresponding to the value of the evaluation step number signal DSN to the evaluation voltage setting value output circuit 7B.
(Step S42)

The evaluation voltage setting value output circuit 7B changes the evaluation voltage setting signal DVS based on the values of the upper-limit voltage and the lower-limit voltage conveyed from the expected voltage setting circuit 15 in the step S40. Specifically, the evaluation voltage setting value output circuit 7B outputs an evaluation voltage setting signal DVS indicating the values of the upper-limit voltage and the lower-limit voltage conveyed from the expected voltage setting circuit 15 in the step S40. The comparator evaluation voltage setting circuit 5 changes the resistance values of the resistance voltage-dividing circuits 12 and 13 based on the evaluation voltage setting signal DVS and thereby changes the ratios K1 and K2.

(Step S44)

When the WAIT count value conveyed from the transition number WAIT time setting circuit 14 to the voltage evaluation control circuit 9B in the step S40 is greater than zero, the process proceeds to a step S50. When the WAIT count value conveyed from the transition number WAIT time setting circuit 14 to the voltage evaluation control circuit 9B in the step S40 is zero, the voltage evaluation control circuit 9B determines that the transition of the power supply voltage PSV matches the expected voltage transition and hence the process proceeds to a step S90.

(Step S50)

The WAIT counter 11B of the voltage evaluation control circuit 9B counts a clock up to the WAIT count value conveyed from the transition number WAIT time setting circuit 14 in the step S40, and thereby secures a wait time. The voltage evaluation control circuit 9B does not output the voltage evaluation implementation instruction signal VDC for indicating the implementation of a voltage evaluation to the voltage evaluation circuit 8 until the wait time has elapsed.

(Steps S60 and S70)

The power supply voltage transition comparison circuit 20B performs a voltage evaluation through an operation similar to that in the step S20 (step S60). When the voltage evaluation result is "FAIL" in the step S60, the process returns to the step S10, whereas when the voltage evaluation result is "PASS" in the step S60, the process returns to the step S40 (step S70).

(Step S90)

The voltage evaluation control circuit 9B outputs a lock cancellation signal LCS indicating the cancellation of the lock of an access-protected circuit.

According to this embodiment, the voltage evaluation control circuit 9B determines the timing at which the voltage evaluation circuit 8 evaluates the power supply voltage PSV based on the WAIT count value that is held and can be changed by the transition number WAIT time setting circuit 14. As a result, the user can change and arbitrarily set the wait time between evaluation steps.

According to this embodiment, the voltage evaluation control circuit 9B determines the number of times that the evaluation voltage setting value output circuit 7B changes the ratio K1 between the power supply voltage PSV and the upper-limit comparison voltage UCV and the ratio K2 between the power supply voltage PSV and the lower-limit comparison voltage LCV based on the WAIT count value that is held and can be changed by the transition number WAIT time setting circuit 14. As a result, the user can change and arbitrarily set the number of times that the evaluation step is repeated.

According to this embodiment, the evaluation voltage setting value output circuit 7B sets the ratio K1 between the power supply voltage PSV and the upper-limit comparison voltage UCV and the ratio K2 between the power supply voltage PSV and the lower-limit comparison voltage LCV based on the values of the upper-limit voltage and the lower-limit voltage that are held and can be changed by the expected voltage setting circuit 15. As a result, the user can change and arbitrarily set the expected voltage in each evaluation step.

As described above, it is possible to change and arbitrarily set the expected voltage transition in the power supply voltage transition comparison circuit 20B. Therefore, it is possible to set a different expected voltage transition for each individual semiconductor product even when they are the same type of semiconductor product. As a result, a user can conceal the expected voltage transition of his/her semiconductor product from other users who use the same type of semiconductor product as that of his/her semiconductor product. Therefore, it is possible to prevent an outsider from illegitimately generating the lock cancellation signal LCS.

Third Embodiment

Figure 9:
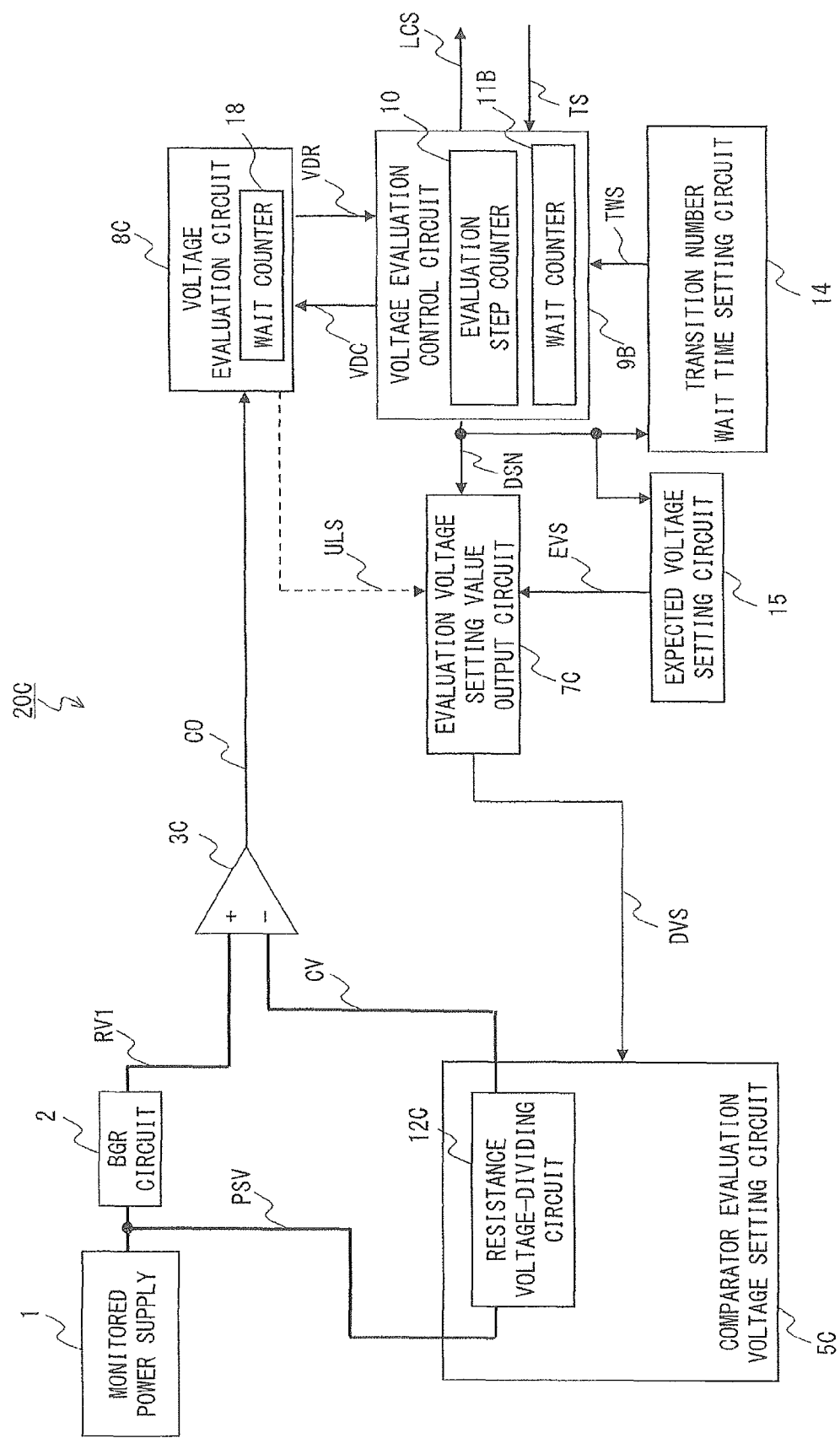
FIG. 9 is a circuit configuration diagram of a power supply voltage transition comparison circuit according to a third embodiment.

FIG. 9 is a circuit configuration diagram of a power supply voltage transition comparison circuit 20C according to a third embodiment. The configuration of the power supply voltage transition comparison circuit 20C is different from that of the power supply voltage transition comparison circuit 20B in the following points. The power supply voltage transition comparison circuit 20C includes a comparator 3C in place of the comparators 3 and 4 of the power supply voltage transition comparison circuit 20B, includes a comparator evaluation voltage setting circuit 5C in place of the comparator evaluation voltage setting circuit 5 of the circuit 20B, and does not include the inverter-equipped AND-gate 6 of the circuit 20B. Further, the power supply voltage transition comparison circuit 20C includes an evaluation voltage setting value output circuit 7C in place of the evaluation voltage setting value output circuit 7B of the circuit 20B, and includes a voltage evaluation circuit 8C in place of the voltage evaluation circuit 8 of the circuit 20B. The BGR circuit 2 outputs the reference voltage RV1 to the +input terminal of the comparator 3C.

The comparator evaluation voltage setting circuit 5C includes a resistance voltage-dividing circuit 12C. The resistance voltage-dividing circuit 12C generates a comparison voltage CV from the power supply voltage PSV and outputs the generated comparison voltage CV to the −input terminal of the comparator 3C. The comparison voltage CV is a divided voltage of the power supply voltage PSV.

The comparator evaluation voltage setting circuit 5C sets a ratio K between the power supply voltage PSV and the comparison voltage CV based on the evaluation voltage setting signal DVS. Note that the evaluation voltage setting signal DVS indicates the upper-limit voltage or the lower-limit voltage of the expected voltage range depending on the situation. When the evaluation voltage setting signal DVS indicates the upper-limit voltage, the comparator evaluation voltage setting circuit 5C sets the ratio K by setting the resistance value of the resistance voltage-dividing circuit 12C so that when the power supply voltage PSV matches the upper-limit voltage, the comparison voltage CV matches the reference voltage RV1. When the evaluation voltage setting signal DVS indicates the lower-limit voltage, the comparator evaluation voltage setting circuit 5C sets the ratio K by setting the resistance value of the resistance voltage-dividing circuit 12C so that when the power supply voltage PSV matches the lower-limit voltage, the comparison voltage CV matches the reference voltage RV1. When the value indicated by the evaluation voltage setting signal DVS changes, the comparator evaluation voltage setting circuit 5C changes the ratio K so that the ratio K conforms to the new value.

The comparator 3C performs a voltage upper-limit comparison or a voltage lower-limit comparison depending on the situation. The comparator 3C compares the reference voltage RV1 input to the +input terminal with the comparison voltage CV input to the −input terminal and outputs a comparator output signal CO, which is a digital signal indicating the comparison result, to the voltage evaluation circuit 8C. The comparator output signal CO is at a low level when the comparison voltage CV is lower than the reference voltage RV1. Further, the comparator output signal CO is at a high level when the comparison voltage CV is higher than the reference voltage RV1. In other words, when the power supply voltage PSV is lower than the voltage indicated by the evaluation voltage setting signal DVS, the comparator output signal CO is at a low level, whereas when the power supply voltage PSV is higher than the voltage indicated by the evaluation voltage setting signal DVS, the comparator output signal CO is at a high level.

The voltage evaluation circuit 8C includes a WAIT counter 18. The voltage evaluation circuit 8C outputs an upper/lower selector signal ULS to the evaluation voltage setting value output circuit 7C. The upper/lower selector signal ULS has a value indicating an upper-limit voltage setting mode (e.g., high level) or a value indicating a lower-limit voltage setting mode (e.g., low level). When the voltage evaluation circuit 8C receives a voltage evaluation implementation instruction signal VDC from the voltage evaluation control circuit 9B, the voltage evaluation circuit 8C determines whether or not the power supply voltage PSV is within the expected voltage range and outputs a voltage evaluation result signal VDR indicating the evaluation result to the voltage evaluation control circuit 9B.

When the upper/lower selector signal ULS has a value indicating the upper-limit voltage setting mode, the voltage evaluation circuit 8C determines whether or not the power supply voltage PSV is lower than the upper-limit voltage of the expected voltage range based on the comparator output signal CO. When the upper/lower selector signal ULS has a value indicating the lower-limit voltage setting mode, the voltage evaluation circuit 8C determines whether or not the power supply voltage PSV is higher than the lower-limit voltage of the expected voltage range based on the comparator output signal CO. In the cases when the power supply voltage PSV is lower than the upper-limit voltage and higher than the lower-limit voltage, the voltage evaluation circuit 8C determines that the power supply voltage PSV is within the expected voltage range. In the other cases, the voltage evaluation circuit 8C determines that the power supply voltage PSV is not within the expected voltage range. The voltage evaluation circuit 8C secures a predetermined wait time by using the WAIT counter 18 after changing the upper/lower selector signal ULS, and then evaluates the power supply voltage PSV based on the comparator output signal CO.

The configurations and the operations of the voltage evaluation control circuit 9B, the transition number WAIT time setting circuit 14, and the expected voltage setting circuit 15 of this embodiment are the same as those in the second embodiment.

When the upper/lower selector signal ULS has a value indicating the upper-limit voltage setting mode, the evaluation voltage setting value output circuit 7C outputs an evaluation voltage setting signal DVS and thereby notifies the comparator evaluation voltage setting circuit 5C of the upper-limit voltage corresponding to the value of the evaluation step number signal DSN. When the upper/lower selector signal ULS has a value indicating the lower-limit voltage setting mode, the evaluation voltage setting value output circuit 7C outputs an evaluation voltage setting signal DVS and thereby notifies the comparator evaluation voltage setting circuit 5C of the lower-limit voltage corresponding to the value of the evaluation step number signal DSN. Note that the upper-limit voltage and the lower-limit voltage are the upper-limit voltage and the lower-limit voltage conveyed from the expected voltage setting circuit 15 through the expected voltage setting signal EVS.

Therefore, the evaluation voltage setting value output circuit 7C changes the voltage setting mode between the upper-limit voltage setting mode and the lower-limit voltage setting mode based on the upper/lower selector signal ULS. In the upper-limit voltage setting mode, the evaluation voltage setting value output circuit 7C sets the ratio K between the power supply voltage PSV and the comparison voltage CV based on the upper-limit voltage of the expected voltage range. In the lower-limit voltage setting mode, the evaluation voltage setting value output circuit 7C sets the ratio K between the power supply voltage PSV and the comparison voltage CV based on the lower-limit voltage of the expected voltage range.

Figure 10:
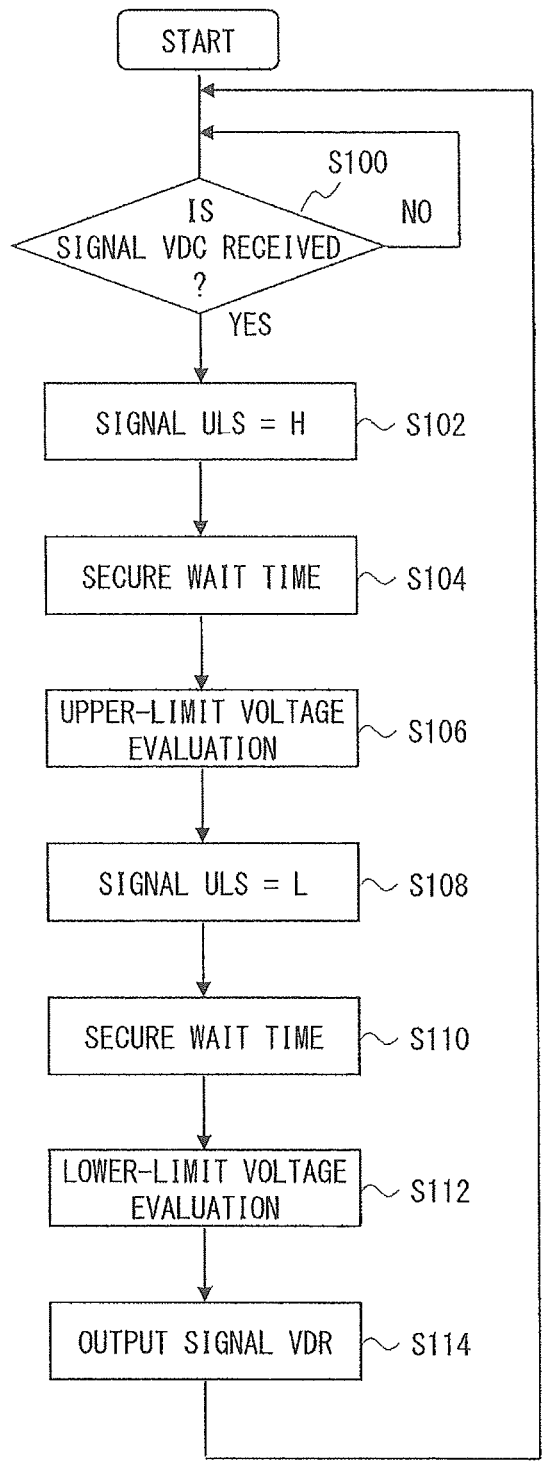
FIG. 10 is a flowchart showing an operation of the power supply voltage transition comparison circuit according to the third embodiment.

FIG. 10 is a flowchart showing an operation of the voltage evaluation circuit 8C. An operation of the voltage evaluation circuit 8C is explained with reference to FIG. 10.
(Step S100)
The voltage evaluation circuit 8C waits for an input of a voltage evaluation implementation instruction signal VDC. When the voltage evaluation circuit 8C receives the voltage evaluation implementation instruction signal VDC, the process proceeds to the step S102.
(Step S102)
The voltage evaluation circuit 8C changes the level of the upper/lower selector signal ULS from the low level to a high level. The low level indicates the lower-limit voltage setting mode and the high level indicates the upper-limit voltage setting mode.
(Step S104)
The WAIT counter 18 of the voltage evaluation circuit 8C measures an elapsed time from when the upper/lower selector signal ULS is changed in the step S102. For example, the WAIT counter 18 measures the elapsed time by counting a clock. The voltage evaluation circuit 8C does not determine whether or not the power supply voltage PSV is lower than the upper-limit voltage based on the comparator output signal CO until the elapsed time reaches a predetermined wait time. In this manner, the voltage evaluation circuit 8C secures a wait time for reflecting the upper-limit voltage, which is used as a setting value, in the comparator 3C.
(Step S106)
The voltage evaluation circuit 8C determines whether or not the power supply voltage PSV is lower than the upper-limit voltage based on the comparator output signal CO. The voltage evaluation circuit 8C determines that the power supply voltage PSV is lower than the upper-limit voltage when the comparator output signal CO is at a low level. Note that since the voltage evaluation circuit 8C is the circuit that changes the upper/lower selector signal ULS, the voltage evaluation circuit 8C recognizes which of the upper-limit voltage comparison and the lower-limit voltage comparison the comparator 3C is performing.
(Steps S108, S110 and S112)
The voltage evaluation circuit 8C changes the level of the upper/lower selector signal ULS from the high level to a low level (step S108). The WAIT counter 18 of the voltage evaluation circuit 8C measures an elapsed time from when the upper/lower selector signal ULS is changed in the step S108. The voltage evaluation circuit 8C does not determine whether or not the power supply voltage PSV is higher than the lower-limit voltage based on the comparator output signal CO until the elapsed time reaches a predetermined wait time. In this manner, the voltage evaluation circuit 8C secures a wait time for reflecting the lower-limit voltage, which is used as a setting value, in the comparator 3C (step S110). The voltage evaluation circuit 8C determines whether or not the power supply voltage PSV is higher than the lower-limit voltage based on the comparator output signal CO (step S112). The voltage evaluation circuit 8C determines that the power supply voltage PSV is higher than the lower-limit voltage when the comparator output signal CO is at a high level. (Step S114)

In the cases when the power supply voltage PSV is lower than the upper-limit voltage in the step S106 and is higher than the lower-limit voltage in the step S112, the voltage evaluation circuit 8C determines that the power supply voltage PSV is within the expected voltage range. In the other cases, the voltage evaluation circuit 8C determines that the power supply voltage PSV is not within the expected voltage range. When the voltage evaluation circuit 8C determines that the power supply voltage PSV is within the expected voltage range, the voltage evaluation circuit 8C notifies the voltage evaluation control circuit 9B that the voltage evaluation result is "PASS" by using a voltage evaluation result signal VDR. Further, when the voltage evaluation circuit 8C determines that the power supply voltage PSV is not within the expected voltage range, the voltage evaluation circuit 8C notifies the voltage evaluation control circuit 9B that the voltage evaluation result is "FAIL" using a voltage evaluation result signal VDR.

Figure 11:
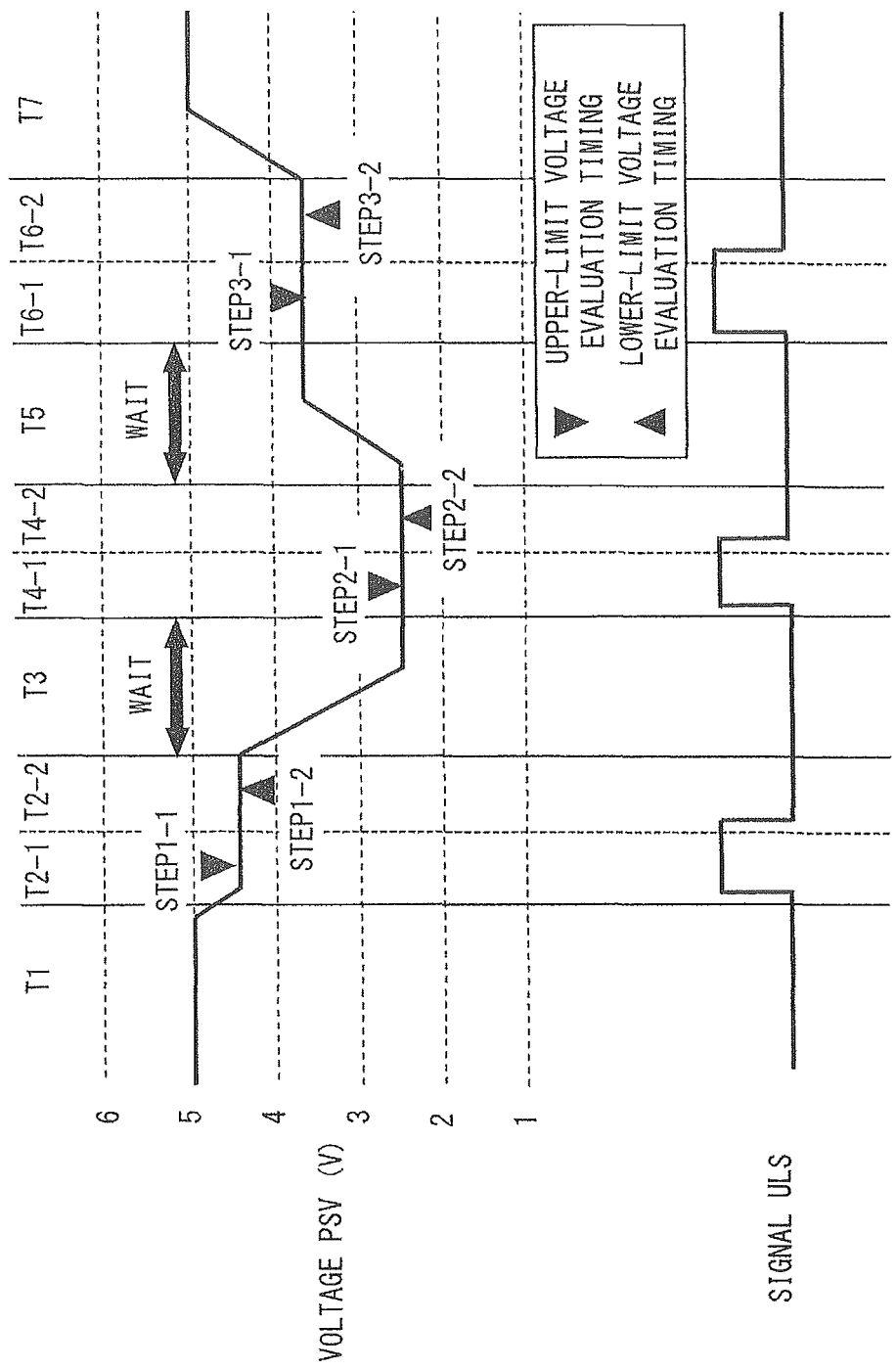
FIG. 11 is a timing chart showing an operation of the power supply voltage transition comparison circuit according to the third embodiment and a transition of a power supply voltage to be monitored.

FIG. 11 is a timing chart showing an operation of the power supply voltage transition comparison circuit 20C and a transition of the power supply voltage PSV. A user possesses information about a plurality of setting value groups associated with a plurality of respective voltage evaluation steps, a wait time(s) between the voltage evaluation steps (wait time(s) in steps S14 and S50), and a wait time(s) within the voltage evaluation steps (wait time(s) in steps S104 and S110). Note that each setting value group includes the upper-limit voltage and the lower-limit voltage of an expected voltage range. A power supply voltage supply apparatus (not shown) used by the user changes the power supply voltage PSV as shown in FIG. 11. The power supply voltage supply apparatus controls the voltage level of the power supply voltage PSV based on the plurality of setting value groups and controls the transition timing of the power supply voltage PSV based on the timing of a trigger signal TS, the wait time(s) between the voltage evaluation steps, and the wait time(s) within the voltage evaluation steps.

In the example shown in FIG. 11, the number of voltage evaluation steps is three. The three voltage evaluation steps correspond to the steps 1 to 3. The step 1 includes an upper-limit voltage evaluation step 1-1 and a lower-limit voltage evaluation step 1-2. The step 2 includes an upper-limit voltage evaluation step 2-1 and a lower-limit voltage evaluation step 2-2. The step 3 includes an upper-limit voltage evaluation step 3-1 and a lower-limit voltage evaluation step 3-2.

In a section T1, when the voltage evaluation control circuit 9B receives a trigger signal TS indicating the start of a power supply voltage transition comparison, the voltage evaluation control circuit 9B initializes the count value of the evaluation step counter 10 to one, and outputs an evaluation step number signal DSN to the evaluation voltage setting value output circuit 7C, the transition number WAIT time setting circuit 14, and the expected voltage setting circuit 15 and thereby conveys the count value of the evaluation step counter 10 (=1) to them. The transition number WAIT time setting circuit 14 outputs a transition number WAIT time setting signal TWS to the voltage evaluation control circuit 9B and thereby conveys a WAIT count value (=3) corresponding to the value of the evaluation step number signal DSN (=1) to the voltage evaluation control circuit 9B. The expected voltage setting circuit 15 outputs an expected voltage setting signal EVS to the evaluation voltage setting value output circuit 7C and thereby conveys the values of the upper-limit voltage and the lower-limit voltage (=5.0V and 4.0V) corresponding to the value of the evaluation step number signal DSN (=1) to the evaluation voltage setting value output circuit 7C. The WAIT counter 11B of the voltage evaluation control circuit 9B counts a clock up to the WAIT count value (=3) conveyed from the transition number WAIT time setting circuit 14 and thereby secures a wait time. Meanwhile, the power supply voltage supply apparatus changes the power supply voltage PSV from the normal voltage 5.0V to a voltage between the upper-limit voltage and the lower-limit voltage for the step 1 (for example, 4.5V) in response to the trigger signal TS.

In a section T2-1, the power supply voltage transition comparison circuit 20C performs the upper-limit voltage evaluation step 1-1. Specifically, the voltage evaluation control circuit 9B instructs the voltage evaluation circuit 8C to carry out a voltage evaluation by outputting a voltage evaluation implementation instruction signal VDC to the voltage evaluation circuit 8C. Upon receiving the voltage evaluation implementation instruction signal VDC (Yes at step S100), the voltage evaluation circuit 8C changes the level of the upper/lower selector signal ULS from the low level to a high level (step S102). Since the upper/lower selector signal ULS is at the high level, the evaluation voltage setting value output circuit 7C outputs an evaluation voltage setting signal DVS to the comparator evaluation voltage setting circuit 5C and thereby conveys the upper-limit voltage (=5.0V) corresponding to the value of the evaluation step number signal DSN (=1) to the comparator evaluation voltage setting circuit 5C. The comparator evaluation voltage setting circuit 5C sets the resistance value of the resistance voltage-dividing circuit 12C based on the evaluation voltage setting signal DVS and thereby sets the ratio K. The resistance voltage-dividing circuit 12C generates a comparison voltage CV from the power supply voltage PSV. The comparator 3C compares the comparison voltage CV with the reference voltage RV1 and outputs a comparator output signal CO indicating the comparison result. The voltage evaluation circuit 8C secures a wait time (step S104), and then determines that the power supply voltage PSV is lower than the upper-limit voltage 5.0V based on the comparator output signal CO (step S106).

In a section T2-2, the power supply voltage transition comparison circuit 20C performs the lower-limit voltage evaluation step 1-2. Specifically, the voltage evaluation circuit 8C changes the level of the upper/lower selector signal ULS from the high level to a low level (step S108). Since the upper/lower selector signal ULS is at the low level, the evaluation voltage setting value output circuit 7C outputs an evaluation voltage setting signal DVS to the comparator evaluation voltage setting circuit 5C and thereby conveys the lower-limit voltage (=4.0V) corresponding to the value of the evaluation step number signal DSN (=1) to the comparator evaluation voltage setting circuit 5C. The comparator evaluation voltage setting circuit 5C sets the resistance value of the resistance voltage-dividing circuit 12C based on the evaluation voltage setting signal DVS and thereby sets the ratio K. The resistance voltage-dividing circuit 12C generates a comparison voltage CV from the power supply voltage PSV. The comparator 3C compares the comparison voltage CV with the reference voltage RV1 and outputs a comparator output signal CO indicating the comparison result. The voltage evaluation circuit 8C secures a wait time (step S110) and then determines that the power supply voltage PSV is higher than the lower-limit voltage 4.0V based on the comparator output signal CO (step S112).

Since the power supply voltage PSV is lower than the upper-limit voltage 5.0V and higher than the lower-limit voltage 4.0V, the voltage evaluation circuit 8C determines that the power supply voltage PSV is within the expected voltage range and notifies the voltage evaluation control circuit 9B that the voltage evaluation result is "PASS" by using a voltage evaluation result signal VDR (step S114). Meanwhile, the power supply voltage supply apparatus keeps the power supply voltage PSV between the upper-limit voltage and the lower-limit voltage for the step 1 in the sections T2-1 and T2-2.

In a section T3, the voltage evaluation control circuit 9B increments the count value of the evaluation step counter 10 to two, and outputs an evaluation step number signal DSN to the evaluation voltage setting value output circuit 7C, the transition number WAIT time setting circuit 14, and the expected voltage setting circuit 15 and thereby conveys the count value of the evaluation step counter 10 (=2) to them. The transition number WAIT time setting circuit 14 outputs a transition number WAIT time setting signal TWS to the voltage evaluation control circuit 9B and thereby conveys a WAIT count value (=10) corresponding to the value of the evaluation step number signal DSN (=2) to the voltage evaluation control circuit 9B. The expected voltage setting circuit 15 outputs an expected voltage setting signal EVS to the evaluation voltage setting value output circuit 7C and thereby conveys the values of the upper-limit voltage and the lower-limit voltage (=3.0V and 2.0V) corresponding to the value of the evaluation step number signal DSN (=2) to the evaluation voltage setting value output circuit 7C. The WAIT counter 11B of the voltage evaluation control circuit 9B counts a clock up to the WAIT count value (=10) conveyed from the transition number WAIT time setting circuit 14 and thereby secures a wait time. Meanwhile, the power supply voltage supply apparatus changes the power supply voltage PSV from the voltage between the upper-limit voltage and the lower-limit voltage for the step 1 to a voltage between the upper-limit voltage and the lower-limit voltage for the step 2 (for example, 2.5V).

In a section T4-1, the power supply voltage transition comparison circuit 20C performs the upper-limit voltage evaluation step 2-1. The operation of the power supply voltage transition comparison circuit 20C performed in the section T4-1 is similar to that of the power supply voltage transition comparison circuit 20C performed in the section T2-1. However, the value of the evaluation step number signal DSN is 2 and the upper-limit voltage is 3.0V.

In a section T4-2, the power supply voltage transition comparison circuit 20C performs the lower-limit voltage evaluation step 2-2. The operation of the power supply voltage transition comparison circuit 20C performed in the section T4-2 is similar to that of the power supply voltage transition comparison circuit 20C in the section T2-2. However, the value of the evaluation step number signal DSN is 2 and the lower-limit voltage is 2.0V.

Since the power supply voltage PSV is lower than the upper-limit voltage 3.0V and higher than the lower-limit voltage 2.0V, the voltage evaluation circuit 8C determines that the power supply voltage PSV is within the expected voltage range and notifies the voltage evaluation control circuit 9B that the voltage evaluation result is "PASS" by using a voltage evaluation result signal VDR (step S114). Meanwhile, the power supply voltage supply apparatus keeps the power supply voltage PSV between the upper-limit voltage and the lower-limit voltage for the step 2 in the sections T4-1 and T4-2.

The operation of the power supply voltage transition comparison circuit 20C performed in the section T5 is similar to that of the power supply voltage transition comparison circuit 20C performed in the section T3. However, the voltage evaluation control circuit 9B increments the count value of the evaluation step counter 10 to three. The value of the evaluation step number signal DSN is 3 and the WAIT count value is 15. Further, the upper-limit voltage is 4.0V and the lower-limit voltage is 3.0V. Meanwhile, the power supply voltage supply apparatus changes the power supply voltage PSV from the voltage between the upper-limit voltage and the lower-limit voltage for the step 2 to a voltage between the upper-limit voltage and the lower-limit voltage for the step 3 (for example, 3.5V).

In a section T6-1, the power supply voltage transition comparison circuit 20C performs the upper-limit voltage evaluation step 3-1. The operation of the power supply voltage transition comparison circuit 20C performed in the section T6-1 is similar to that of the power supply voltage transition comparison circuit 20C performed in the section T2-1. However, the value of the evaluation step number signal DSN is 3 and the upper-limit voltage is 4.0V.

In a section T6-2, the power supply voltage transition comparison circuit 20C performs the lower-limit voltage evaluation step 3-2. The operation of the power supply voltage transition comparison circuit 20C performed in the section T6-2 is similar to that of the power supply voltage transition comparison circuit 20C in the section T2-2. However, the value of the evaluation step number signal DSN is 3 and the lower-limit voltage is 3.0V.

Since the power supply voltage PSV is lower than the upper-limit voltage 4.0V and higher than the lower-limit voltage 3.0V, the voltage evaluation circuit 8C determines that the power supply voltage PSV is within the expected voltage range and notifies the voltage evaluation control circuit 9B that the voltage evaluation result is "PASS" by using a voltage evaluation result signal VDR (step S114). Meanwhile, the power supply voltage supply apparatus keeps the power supply voltage PSV between the upper-limit voltage and the lower-limit voltage for the step 3 in the sections T6-1 and T6-2.

In a section T7, the voltage evaluation control circuit 9B increments the count value of the evaluation step counter 10 to four, and outputs an evaluation step number signal DSN to the evaluation voltage setting value output circuit 7C, the transition number WAIT time setting circuit 14, and the expected voltage setting circuit 15 and thereby conveys the count value of the evaluation step counter 10 (=4) to them. The transition number WAIT time setting circuit 14 outputs a transition number WAIT time setting signal TWS to the voltage evaluation control circuit 9B and thereby conveys a WAIT count value (=0) corresponding to the value of the evaluation step number signal DSN (=4) to the voltage evaluation control circuit 9B. The expected voltage setting circuit 15 outputs an expected voltage setting signal EVS to the evaluation voltage setting value output circuit 7C and thereby conveys the values of the upper-limit voltage and the lower-limit voltage (=5.0V and 4.0V) corresponding to the value of the evaluation step number signal DSN (=4) to the evaluation voltage setting value output circuit 7C. Since the WAIT count value conveyed from the transition number WAIT time setting circuit 14 is zero, the voltage evaluation control circuit 9B determines that the transition of the power supply voltage PSV matches the expected voltage transition and outputs a lock cancellation signal LCS. Meanwhile, the power supply voltage supply apparatus returns the power supply voltage PSV to the normal voltage 5.0V.

According to this embodiment, the number of comparators can be reduced from two to one, thus making it possible to reduce the circuit size of the power supply voltage transition comparison circuit 20C. This is because by changing the voltage setting mode between the upper-limit voltage setting mode in which the ratio K between the comparison voltage CV input to the comparator 3C and the power supply voltage PSV is set based on the upper-limit voltage, and the lower-limit voltage setting mode in which the ratio K is set based on the lower-limit voltage, it is possible to determine whether or not the power supply voltage PSV is within the expected voltage range based on the output of the comparator 3C.

Note that in the step S106, when the power supply voltage PSV is higher than the upper-limit voltage (when the comparator output signal CO is at a high level), the voltage evaluation circuit 8C may repeat the determination whether or not the power supply voltage PSV is lower than the higher-limit voltage. Further, either of the upper-limit voltage evaluation and the lower-limit voltage evaluation may be performed before the other voltage evaluation. In other words, the steps S108 to S112 may be performed after the steps S102 to S106 are performed. Alternatively, the steps S102 to S106 may be performed after the steps S108 to S112 are performed. Further, the power supply voltage transition comparison circuit 20C may be configured so that the transition number WAIT time setting circuit 14 and the expected voltage setting circuit 15 are not used.

Fourth Embodiment

Figure 12:
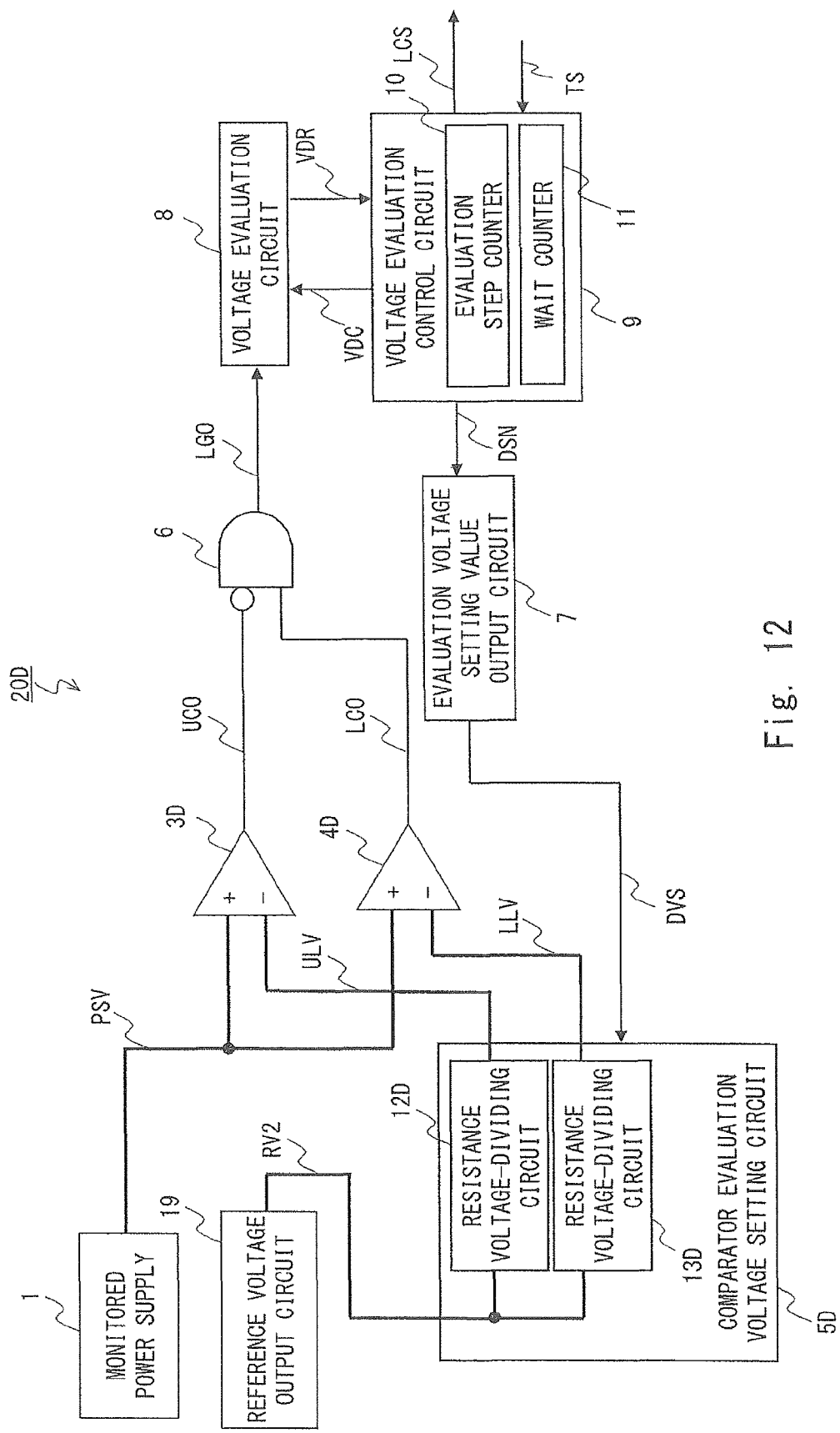
FIG. 12 is a circuit configuration diagram of a power supply voltage transition comparison circuit according to a fourth embodiment.

FIG. 12 is a circuit configuration diagram of a power supply voltage transition comparison circuit 20D according to a fourth embodiment. The configuration of the power supply voltage transition comparison circuit 20D is different from that of the power supply voltage transition comparison circuit 20A in that the comparator evaluation voltage setting circuit is disposed on the reference voltage side in the power supply voltage transition comparison circuit 20D. Further, the power supply voltage transition comparison circuit 20D does not include the BGR circuit 2, while it includes a reference voltage output circuit 19. Further, the power supply voltage transition comparison circuit 20D includes a comparator evaluation voltage setting circuit 5D in place of the comparator evaluation voltage setting circuit 5 included in the circuit 20A and includes comparators 3D and 4D in place of the comparators 3 and 4 included in the circuit 20A.

The comparator evaluation voltage setting circuit 5D generates an upper-limit voltage ULV and a lower-limit voltage LLV as divided voltages of a reference voltage RV2. The comparator 3D compares the upper-limit voltage ULV with the power supply voltage PSV. The comparator 4D compares the lower-limit voltage LLV with the power supply voltage PSV. The voltage evaluation circuit 8 evaluates the power supply voltage PSV based on the result of the comparison between the power supply voltage PSV and the upper-limit voltage ULV and the result of the comparison between the power supply voltage PSV and the lower-limit voltage LLV. The evaluation voltage setting value output circuit 7 changes a ratio K3 between the reference voltage RV2 and the upper-limit voltage ULV and a ratio K4 between the reference voltage RV2 and the lower-limit voltage LLV.

According to this embodiment, it is possible to increase the number of expected voltage levels, which are compared with the power supply voltage PSV, without increasing the number of comparators. This is because the ratio K3 between the reference voltage RV2 and the upper-limit voltage ULV and the ratio K4 between the reference voltage RV2 and the lower-limit voltage LLV are changed based on the result of the comparison between the power supply voltage PSV and the upper-limit voltage ULV and the result of the comparison between the power supply voltage PSV and the lower-limit voltage LLV. Therefore, it is possible to lower the probability of an accidental match between the transition of the power supply voltage PSV and the expected voltage transition while minimizing the increase in the circuit size of the power supply voltage transition comparison circuit 20D.

Next, a configuration of the power supply voltage transition comparison circuit 20D is explained in detail.

The monitored power supply 1 outputs the power supply voltage PSV to the −input terminals of the comparators 3D and 4D. The reference voltage output circuit 19 outputs a reference voltage RV2 to the comparator evaluation voltage setting circuit 5D. The reference voltage output circuit 19 keeps the reference voltage RV2 at a predetermined fixed voltage. The reference voltage RV2 is preferably higher than the normal voltage of the power supply voltage PSV. The comparator evaluation voltage setting circuit 5D includes resistance voltage-dividing circuits 12D and 13D. The resistance voltage-dividing circuit 12D generates an upper-limit voltage ULV from the reference voltage RV2 and outputs the upper-limit voltage ULV to the +input terminal of the comparator 3D. The resistance voltage-dividing circuit 13D generates a lower-limit voltage LLV from the reference voltage RV2 and outputs the lower-limit voltage LLV to the +input terminal of the comparator 4D. The upper-limit voltage ULV and the lower-limit voltage LLV are divided voltages of the reference voltage RV2.

The comparator evaluation voltage setting circuit 5D sets a ratio K3 between the reference voltage RV2 and the upper-limit voltage ULV and a ratio K4 between the reference voltage RV2 and the lower-limit voltage LLV at the same time based on the evaluation voltage setting signal DVS. Note that the evaluation voltage setting signal DVS indicates the upper-limit voltage and the lower-limit voltage of an expected voltage range. The comparator evaluation voltage setting circuit 5D sets the resistance value of the resistance voltage-dividing circuit 12D and thereby sets the ratio K3 so that the upper-limit voltage ULV matches the upper-limit voltage indicated by the evaluation voltage setting signal DVS. The comparator evaluation voltage setting circuit 5D sets the resistance value of the resistance voltage-dividing circuit 13D and thereby sets the ratio K4 so that the lower-limit voltage LLV matches the lower-limit voltage indicated by the evaluation voltage setting signal DVS. When the upper-limit voltage and the lower-limit voltage indicated by the evaluation voltage setting signal DVS change, the comparator evaluation voltage setting circuit 5D changes the ratios K3 and K4 so that they conform to the new upper-limit voltage and lower-limit voltage.

The comparator 3D performs a voltage upper-limit comparison. The comparator 3D compares the upper-limit voltage ULV input to the +input terminal with the power supply voltage PSV input to the −input terminal and outputs a comparator output signal UCO, which is a digital signal indicating the comparison result, to the inverter-side input terminal of the inverter-equipped AND-gate 6. The comparator output signal UCO is at a low level when the power supply voltage PSV is lower than the upper-limit voltage ULV. Further, the comparator output signal UCO is at a high level when the power supply voltage PSV is higher than the upper-limit voltage ULV. In other words, when the power supply voltage PSV is lower than the upper-limit voltage indicated by the evaluation voltage setting signal DVS, the comparator output signal UCO is at a low level, whereas when the power supply voltage PSV is higher than the upper-limit voltage indicated by the evaluation voltage setting signal DVS, the comparator output signal UCO is at a high level.

The comparator 4D performs a voltage lower-limit comparison. The comparator 4D compares the lower-limit voltage LLV input to the +input terminal with the power supply voltage PSV input to the −input terminal and outputs a comparator output signal LCO, which is a digital signal indicating the comparison result, to the other input terminal of the inverter-equipped AND-gate 6. The comparator output signal LCO is at a low level when the power supply voltage PSV is lower than the lower-limit voltage LLV. Further, the comparator output signal LCO is at a high level when the power supply voltage PSV is higher than the lower-limit voltage LLV. In other words, when the power supply voltage PSV is lower than the lower-limit voltage indicated by the evaluation voltage setting signal DVS, the comparator output signal LCO is at a low level, whereas when the power supply voltage PSV is higher than the lower-limit voltage indicated by the evaluation voltage setting signal DVS, the comparator output signal LCO is at a high level.

The configurations and the operations of the inverter-equipped AND-gate 6, the voltage evaluation circuit 8, the evaluation voltage setting value output circuit 7, and the voltage evaluation control circuit 9 are similar to those in the first embodiment.

The power supply voltage transition comparison circuit 20D repeats the evaluation step while changing the ratio K3 between the reference voltage RV2 and the upper-limit voltage ULV and the ratio K4 between the reference voltage VR2 and the lower-limit voltage LLV, and thereby determines whether or not the transition of the power supply voltage PSV matches the expected voltage transition. The evaluation step includes generating an upper-limit voltage ULV and a lower-limit voltage LLV from the reference voltage RV2, comparing the power supply voltage PSV with the upper-limit voltage ULV, comparing the power supply voltage PSV with the lower-limit voltage LLV, and determining whether or not the power supply voltage PSV matches a predetermined expected voltage based on the comparison results. When the power supply voltage PSV matches the predetermined expected voltage, the power supply voltage transition comparison circuit 20D performs the next evaluation step.

Note that the control method for the power supply voltage transition comparison circuit 20D performed by the voltage evaluation control circuit 9 may be implemented by a computer that runs based on a computer program. The control method includes outputting an evaluation step number signal DSN indicating a count value to the evaluation voltage setting value output circuit 7, outputting a voltage evaluation implementation instruction signal VDC to the voltage evaluation circuit 8, and updating the count value based on a voltage evaluation result signal VDR.

Note that the comparator evaluation voltage setting circuit 5D generates the upper-limit voltage ULV and the lower-limit voltage LLV as divided voltages of the reference voltage RV2. The comparator 3D compares the upper-limit voltage ULV with the power supply voltage PSV. The comparator 4D compares the lower-limit voltage LLV with the power supply voltage PSV. When the voltage evaluation circuit 8 receives a voltage evaluation implementation instruction signal VDC, the voltage evaluation circuit 8 evaluates the power supply voltage PSV based on the comparator output signals UCO and LCO output from the comparators 3D and 4D and outputs a voltage evaluation result signal VDR indicating the evaluation result. The evaluation voltage setting value output circuit 7 sets the ratio K3 between the reference voltage RV2 and the upper-limit voltage ULV and the ratio K4 between the reference voltage RV2 and the lower-limit voltage LLV based on a predetermined setting value associated with the value of the evaluation step number signal DSN.

This embodiment may be combined with the second embodiment or combined with the third embodiment.

Fifth Embodiment

Figure 13:
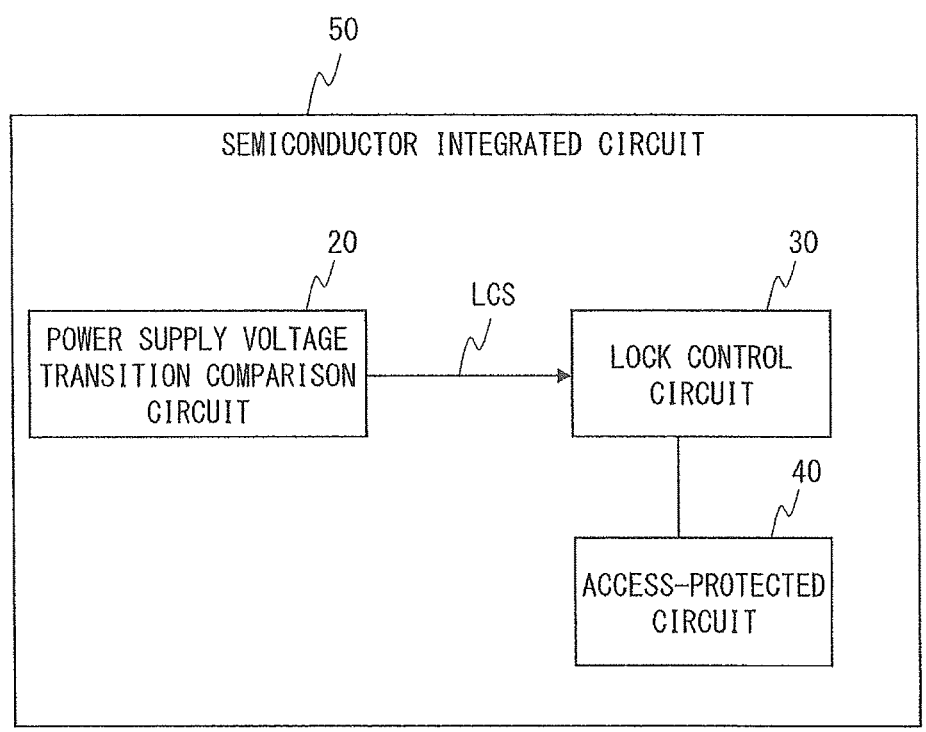
FIG. 13 is a schematic diagram of a semiconductor integrated circuit according to a fifth embodiment.

FIG. 13 is a schematic configuration diagram of a semiconductor integrated circuit 50 according to a fifth embodiment. The semiconductor integrated circuit 50 includes a power supply voltage transition comparison circuit 20, a lock control circuit 30, and a circuit 40 to which access is protected (hereinafter called "access-protected circuit 40"). The power supply voltage transition comparison circuit 20 may be any one of the power supply voltage transition comparison circuits 20A to 20D. The power supply voltage transition comparison circuit 20 determines whether or not the transition of the power supply voltage PSV matches a predetermined expected voltage transition. Then, when the transition of the power supply voltage PSV matches the predetermined expected voltage transition, the power supply voltage transition comparison circuit 20 outputs a lock cancellation signal LCS to the lock control circuit 30. The lock control circuit 30 cancels the lock of the access-protected circuit 40 based on the lock cancellation signal LCS.

According to this embodiment, it is possible to cancel the lock of the access-protected circuit 40 based on the transition of the power supply voltage PSV.

Further, the above-described program can be stored in various types of non-transitory computer readable media and thereby supplied to computers. The non-transitory computer readable media includes various types of tangible storage media. Examples of the non-transitory computer readable media include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program can be supplied to computers by using various types of transitory computer readable media. Examples of the transitory computer readable media include an electrical signal, an optical signal, and an electromagnetic wave. The transitory computer readable media can be used to supply programs to computer through a wire communication path such as an electrical wire and an optical fiber, or wireless communication path.

The present invention made by the inventor has been explained above in a specific manner based on embodiments. However, the present invention is not limited to the above-described embodiments, and needless to say, various modifications can be made without departing from the spirit and scope of the present invention.

Further, a part of the contents described above in the embodiments is described below.
(1) A power supply voltage transition comparison method includes repeating an evaluation step while changing a ratio between a divided voltage of one of a power supply voltage and a reference voltage and the one voltage, and thereby determining whether or not a power supply voltage transition matches an expected voltage transition. The evaluation step includes generating the divided voltage from the one voltage, comparing the other of the power supply voltage and the reference voltage with the divided voltage, and determining whether or not the power supply voltage matches an expected voltage based on the comparison result between the other voltage and the divided voltage. The power supply voltage transition comparison method includes performing a next evaluation step when it is determined that the power supply voltage matches the expected voltage.

(2) The power supply voltage transition comparison method described in the item (1) further includes arbitrarily setting the expected voltage transition.
(3) The power supply voltage transition comparison method described in the item (1) further includes arbitrarily setting a wait time between the evaluation steps.
(4) The power supply voltage transition comparison method described in the item (1) further includes arbitrarily setting the number of times that the evaluation step is repeated.
(5) The power supply voltage transition comparison method described in the item (1) further includes arbitrarily setting the expected voltage in each evaluation step.
(6) A program that causes a computer to execute a control method for a power supply voltage transition comparison circuit. The power supply voltage transition comparison circuit includes a comparator evaluation voltage setting circuit, a comparator, a voltage evaluation circuit, and an evaluation voltage setting value output circuit. The comparator evaluation voltage setting circuit generates a divided voltage of one of a power supply voltage and a reference voltage. The comparator compares the other of the power supply voltage and the reference voltage with the divided voltage. When the voltage evaluation circuit receives a voltage evaluation implementation instruction signal, the voltage evaluation circuit evaluates the power supply voltage based on an output of the comparator and outputs a voltage evaluation result signal indicating a result of an evaluation of the power supply voltage. The evaluation voltage setting value output circuit sets a ratio between the one voltage and the divided voltage based on a predetermined setting value associated with a value of an evaluation step number signal. The control method includes outputting an evaluation step number signal indicating a count value to the evaluation voltage setting value output circuit, outputting a voltage evaluation implementation instruction signal to the voltage evaluation circuit, and updating the count value based on a voltage evaluation result signal.
(7) In the program described in the item (6), the control method further includes securing a predetermined wait time from when the evaluation step number signal is output to when the voltage evaluation implementation instruction signal is output.
(8) In the program described in the item (6), the control method further includes outputting a lock cancellation signal indicating a cancellation of a lock of an access-protected circuit when the count value is a last value and the voltage evaluation result signal indicates that the power supply voltage is within an expected voltage range.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A power supply voltage transition comparison circuit comprising:
a comparator evaluation voltage setting circuit that generates a first divided voltage of a power supply voltage;
a first comparator that compares a reference voltage with the first divided voltage;
a voltage evaluation circuit that evaluates the power supply voltage based on a result of a comparison between the reference voltage and the first divided voltage;
an evaluation voltage setting value output circuit that changes a ratio between the power supply voltage and the first divided voltage based on a result of an evaluation of the power supply voltage; and
a voltage evaluation control circuit, wherein the voltage evaluation control circuit comprises an evaluation step counter that counts a number of evaluation steps based on the result of the evaluation of the power supply voltage output from the voltage evaluation circuit, and outputs a count value of the evaluation step counter to the evaluation voltage setting value output circuit, the evaluation voltage setting value output circuit sets the ratio between the power supply voltage and the first divided voltage based on a setting value associated with the count value, and the voltage evaluation control circuit outputs a lock cancellation signal indicating a cancellation of a lock of an access-protected circuit when the count value of the evaluation step counter is an upper-limit value for the evaluation step number and the evaluation result of the power supply voltage output from the voltage evaluation circuit indicates that the power supply voltage is within an expected voltage range.

2. The power supply voltage transition comparison circuit according to claim 1, further comprising:
a voltage evaluation control circuit that determines whether or not a power supply voltage transition matches an expected voltage transition based on the result of the evaluation of the power supply voltage; and
a setting circuit that holds a setting value of the expected voltage transition, the setting circuit being able to change the setting value.

3. The power supply voltage transition comparison circuit according to claim 1, further comprising:
a setting circuit that holds a setting value, the setting circuit being able to change the setting value; and
a voltage evaluation control circuit that determines a timing at which the voltage evaluation circuit evaluates the power supply voltage based on the setting value.

4. The power supply voltage transition comparison circuit according to claim 1, further comprising:
a setting circuit that holds a setting value, the setting circuit being able to change the setting value; and
a voltage evaluation control circuit that determines the number of times that the evaluation voltage setting value output circuit changes the ratio between the power supply voltage and the first divided voltage based on the setting value.

5. The power supply voltage transition comparison circuit according to claim 1, further comprising a setting circuit that holds a setting value, the setting circuit being able to change the setting value, wherein the evaluation voltage setting value output circuit sets the ratio between the power supply voltage and the first divided voltage based on the setting value.

6. The power supply voltage transition comparison circuit according to claim 1, further comprising a second comparator,
wherein the comparator evaluation voltage setting circuit includes a first voltage-dividing circuit that generates the first divided voltage from the power supply voltage and a second voltage-dividing circuit that generates a second divided voltage from the power supply voltage,
wherein the evaluation voltage setting value output circuit sets a ratio between the power supply voltage and the first divided voltage based on an upper-limit voltage of an expected voltage range and sets a ratio between the power supply voltage and the second divided voltage based on a lower-limit voltage of the expected voltage range, wherein the second comparator compares the reference voltage with the second divided voltage, and wherein the voltage evaluation circuit determines whether or not the power supply voltage is within the expected voltage range based on an output of the first comparator and an output of the second comparator.

7. The power supply voltage transition comparison circuit according to claim 1, wherein the evaluation voltage setting value output circuit changes a voltage setting mode between an upper-limit voltage setting mode in which the ratio between the power supply voltage and the first divided voltage is set based on an upper-limit voltage of an expected voltage range, and a lower-limit voltage setting mode in which the ratio between the power supply voltage and the first divided voltage is set based on a lower-limit voltage of the expected voltage range based on an upper/lower selector signal output by the voltage evaluation circuit, and the voltage evaluation circuit determines whether or not the power supply voltage is within the expected voltage range based on an output of the first comparator.

8. The power supply voltage transition comparison circuit according to claim 7, wherein the voltage evaluation circuit secures a predetermined wait time after the voltage evaluation circuit changes the upper/lower selector signal from a value indicating one of the upper-limit voltage setting mode and the lower-limit voltage setting mode to a value indicating the other of the upper-limit voltage setting mode and the lower-limit voltage setting mode, and then determines whether the power supply voltage is lower than the upper-limit voltage or determines whether the power supply voltage is higher than the lower-limit voltage based on the output of the first comparator.

9. The power supply voltage transition comparison circuit according to claim 1, wherein the voltage evaluation control circuit secures a predetermined wait time after the voltage evaluation control circuit outputs the count value, and then instructs the voltage evaluation circuit to evaluate the power supply voltage.

10. The power supply voltage transition comparison circuit according to claim 1, further comprising a reference voltage generation circuit that generates the reference voltage from the power supply voltage.

11. A power supply voltage transition comparison method comprising:
generating a divided voltage of a power supply voltage;
comparing a reference voltage with the divided voltage;
evaluating the power supply voltage based on a result of a comparison between the reference voltage and the divided voltage;
changing a ratio between the power supply voltage and the divided voltage based on a result of an evaluation of the power supply voltage;
counting a number of evaluation steps based on the result of the evaluation of the power supply voltage;
outputting a count value of the evaluation step number;
setting the ratio between the power supply voltage and the divided voltage based on a setting value associated with the count value, and cancelling a lock of an access-protected circuit when the count value of the evaluation step number is an upper-limit value for the evaluation step number and the evaluation result of the power supply voltage indicates that the power supply voltage is within an expected voltage range.

12. The power supply voltage transition comparison method according to claim 11, further comprising: holding a setting value for an expected voltage transition, the setting value being changeable, and determining whether or not a transition of the power supply voltage matches the expected voltage transition based on the result of the evaluation of the power supply voltage.

13. The power supply voltage transition comparison method according to claim 11, further comprising:
setting a ratio between the power supply voltage and a first divided voltage based on an upper-limit voltage of an expected voltage range, and setting a ratio between the power supply voltage and a second divided voltage based on a lower-limit voltage of the expected voltage range,
wherein the generating of the divided voltage comprises:
generating, by a first voltage-dividing circuit, the first divided voltage from the power supply voltage; and
generating, by a second voltage-dividing circuit, the second divided voltage from the power supply voltage,
the comparing of the reference voltage with the divided voltage comprises:
comparing, by a first comparator, the reference voltage with the first divided voltage; and
comparing, by a second comparator, the reference voltage with the second divided voltage, and
the evaluating of the power supply voltage comprises determining whether or not the power supply voltage is within the expected voltage range based on an output of the first comparator and an output of the second comparator.

14. The power supply voltage transition comparison method according to claim 11, further comprising changing, by a voltage evaluation circuit, a voltage setting mode between an upper-limit voltage setting mode and a lower-limit voltage setting mode, wherein in the upper-limit voltage setting mode, the ratio between the power supply voltage and the divided voltage is set based on an upper-limit voltage of an expected voltage range, in the lower-limit voltage setting mode, the ratio between the power supply voltage and the divided voltage is set based on a lower-limit voltage of the expected voltage range, and the evaluating of the power supply voltage comprises evaluating, by the voltage evaluation circuit, whether or not the power supply voltage is within the expected voltage range based on an output of a comparator that compares the reference voltage with the divided voltage.

15. The power supply voltage transition comparison method according to claim 11, further comprising generating the reference voltage from the power supply voltage.

16. The power supply voltage transition comparison method according to claim 11, further comprising:
determining whether or not a power supply voltage transition matches an expected voltage transition based on the result of the evaluation of the power supply voltage; and
cancelling a lock of an access-protected circuit when the power supply voltage transition matches the expected voltage transition.

* * * * *